(12) United States Patent
Tsai et al.

(10) Patent No.: US 11,107,931 B2
(45) Date of Patent: Aug. 31, 2021

(54) STRUCTURE AND FORMATION METHOD OF SEMICONDUCTOR DEVICE STRUCTURE WITH NANOWIRES

(71) Applicant: Taiwan Semiconductor Manufacturing Co., Ltd., Hsinchu (TW)

(72) Inventors: Wilman Tsai, Saratoga, CA (US); Cheng-Hsien Wu, Hsinchu (TW); I-Sheng Chen, Taipei (TW); Stefan Rusu, Sunnyvale, CA (US)

(73) Assignee: TAIWAN SEMICONDUCTOR MANUFACTURING CO., LTD, Hsinchu (TW)

( * ) Notice: Subject to any disclaimer, the term of this patent is extended or adjusted under 35 U.S.C. 154(b) by 0 days.

(21) Appl. No.: 16/574,318

(22) Filed: Sep. 18, 2019

(65) Prior Publication Data

US 2020/0013904 A1 Jan. 9, 2020

Related U.S. Application Data

(63) Continuation of application No. 15/873,929, filed on Jan. 18, 2018, now Pat. No. 10,431,696.
(Continued)

(51) Int. Cl.
*H01L 29/786* (2006.01)
*H01L 27/092* (2006.01)
(Continued)

(52) U.S. Cl.
CPC .. *H01L 29/78696* (2013.01); *H01L 21/02603* (2013.01); *H01L 21/823814* (2013.01);
(Continued)

(58) Field of Classification Search
CPC ........ H01L 29/78696; H01L 29/66742; H01L 29/4908; H01L 29/66545; H01L 29/78618; H01L 29/42392; H01L 29/0673; H01L 29/78654; H01L 29/66439; H01L 29/66772; H01L 27/092; H01L 21/02603; H01L 21/823842; H01L 21/823814; H01L 27/088; H01L 21/823418; H01L 21/823412; H01L 21/823807;
(Continued)

(56) References Cited

U.S. PATENT DOCUMENTS 9,209,247 B2 12/2015 Colinge et al.
9,236,267 B2 1/2016 De et al.
(Continued)

*Primary Examiner* — Kyoung Lee
*Assistant Examiner* — Christina A Sylvia
(74) *Attorney, Agent, or Firm* — McClure, Qualey & Rodack, LLP

(57) ABSTRACT

Structures and formation methods of a semiconductor device structure are provided. The semiconductor device structure includes a substrate including a first fin portion, a first nanostructure over the first fin portion. The first nanostructure has a dumbbell shape. The first nanostructure includes a semiconductor material layer over the first fin portion, and a cladding layer surrounding the semiconductor material layer. The semiconductor material layer has a rectangular shape, and the cladding layer has a hexagonal or quadrilateral shape. The semiconductor device structure includes a first gate structure surrounding the first nanostructure.

20 Claims, 24 Drawing Sheets

Related U.S. Application Data

(60) Provisional application No. 62/583,065, filed on Nov. 8, 2017.

(51) Int. Cl.

| | |
|---|---|
| *H01L 29/06* | (2006.01) |
| *H01L 29/423* | (2006.01) |
| *H01L 29/66* | (2006.01) |
| *H01L 21/02* | (2006.01) |
| *H01L 21/8238* | (2006.01) |
| *H01L 29/49* | (2006.01) |
| H01L 27/088 | (2006.01) |
| H01L 21/8234 | (2006.01) |

(52) U.S. Cl.
CPC .... *H01L 21/823842* (2013.01); *H01L 27/092* (2013.01); *H01L 29/0673* (2013.01); *H01L 29/42392* (2013.01); *H01L 29/4908* (2013.01); *H01L 29/66439* (2013.01); *H01L 29/66545* (2013.01); *H01L 29/66742* (2013.01); *H01L 29/66772* (2013.01); *H01L 29/78618* (2013.01); *H01L 29/78654* (2013.01); *H01L 21/823412* (2013.01); *H01L 21/823418* (2013.01); *H01L 21/823807* (2013.01); *H01L 27/088* (2013.01)

(58) Field of Classification Search
CPC ............. H01L 29/41725; H01L 29/775; H01L 29/401; H01L 29/66469; H01L 29/045; H01L 29/068; B82Y 10/00; B82Y 40/00
See application file for complete search history.

(56) References Cited

U.S. PATENT DOCUMENTS

| | | | |
|---|---|---|---|
| 9,412,817 | B2 | 8/2016 | Yang et al. |
| 9,412,828 | B2 | 8/2016 | Ching et al. |
| 9,472,618 | B2 * | 10/2016 | Oxland ............. H01L 21/02458 |
| 9,502,265 | B1 | 11/2016 | Jiang et al. |
| 9,520,482 | B1 | 12/2016 | Chang et al. |
| 9,536,738 | B2 | 1/2017 | Huang et al. |
| 9,576,814 | B2 | 2/2017 | Wu et al. |
| 9,608,116 | B2 | 3/2017 | Ching et al. |
| 2013/0049608 | A1 * | 2/2013 | Tatavoosian ....... H05B 41/3927 |
| | | | 315/154 |
| 2016/0190233 | A1 | 6/2016 | Chang et al. |
| 2016/0204276 | A1 | 7/2016 | Dasgupta et al. |
| 2017/0005195 | A1 * | 1/2017 | Ching .................. H01L 29/165 |
| 2017/0077232 | A1 * | 3/2017 | Balakrishnan .... H01L 29/66787 |

* cited by examiner

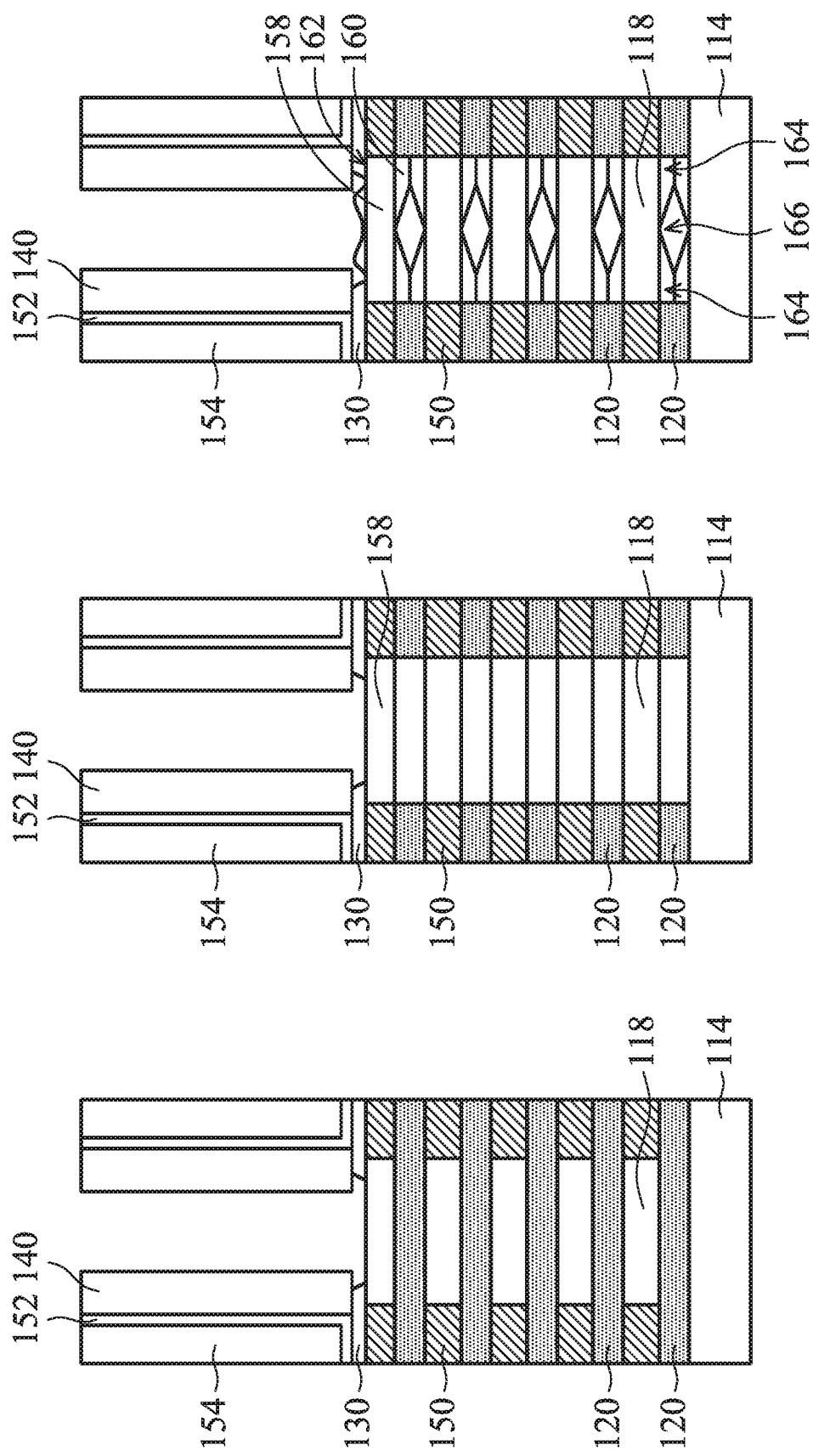

STRUCTURE AND FORMATION METHOD OF SEMICONDUCTOR DEVICE STRUCTURE WITH NANOWIRES

PRIORITY CLAIM AND CROSS-REFERENCE

This application is a Continuation application of U.S. patent application Ser. No. 15/873,929 filed on Jan. 18, 2018, which claims the benefit of U.S. Provisional Application No. 62/583,065, entitled "STRUCTURE AND FORMATION METHOD OF SEMICONDUCTOR DEVICE STRUCTURE WITH NANOWIRES" filed on Nov. 8, 2017, the entirety of which is incorporated herein by reference.

BACKGROUND

The semiconductor integrated circuit (IC) industry has experienced rapid growth. Technological advances in IC materials and design have produced generations of ICs. Each generation has smaller and more complex circuits than the previous generation.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

Such scaling down has also increased the complexity of processing and manufacturing ICs and, for these advances to be realized, similar developments in IC processing and manufacturing are needed. For example, a three-dimensional transistor, such as a semiconductor device with nanowires, has been introduced to replace planar transistors.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 4A-4C are schematic views of various stages of a process for forming a semiconductor device structure, in accordance with some embodiments.

DETAILED DESCRIPTION

Figure 1A:
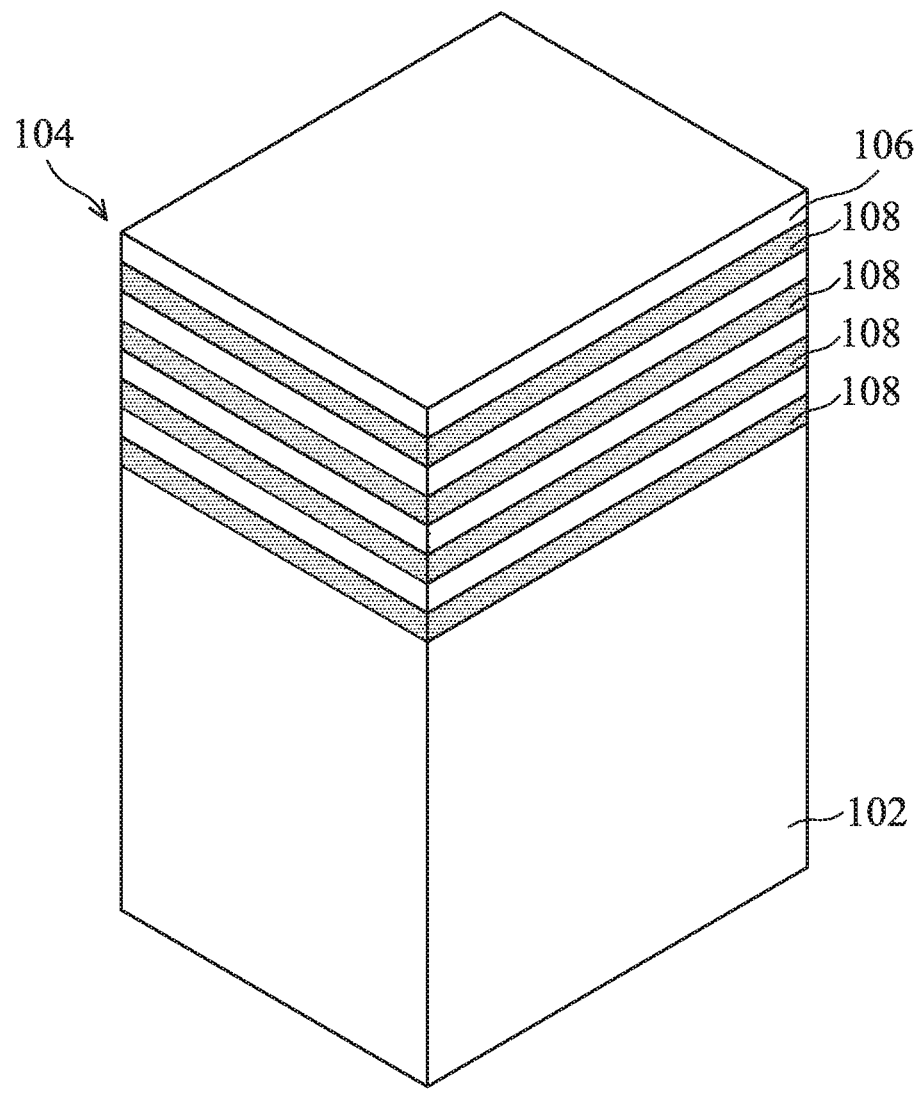
FIGS. 1A-1P are schematic views of various stages of a process for forming a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Moreover, the formation of a first feature over or on a second feature in the description that follows may include embodiments in which the first and second features are formed in direct contact, and may also include embodiments in which additional features may be formed between the first and second features, such that the first and second features may not be in direct contact. In some embodiments, the present disclosure may repeat reference numerals and/or letters in some various examples. This repetition is for the purpose of simplicity and clarity and does not in itself dictate a relationship between some various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

The gate all around (GAA) transistor structures may be patterned using any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Figure 1B:
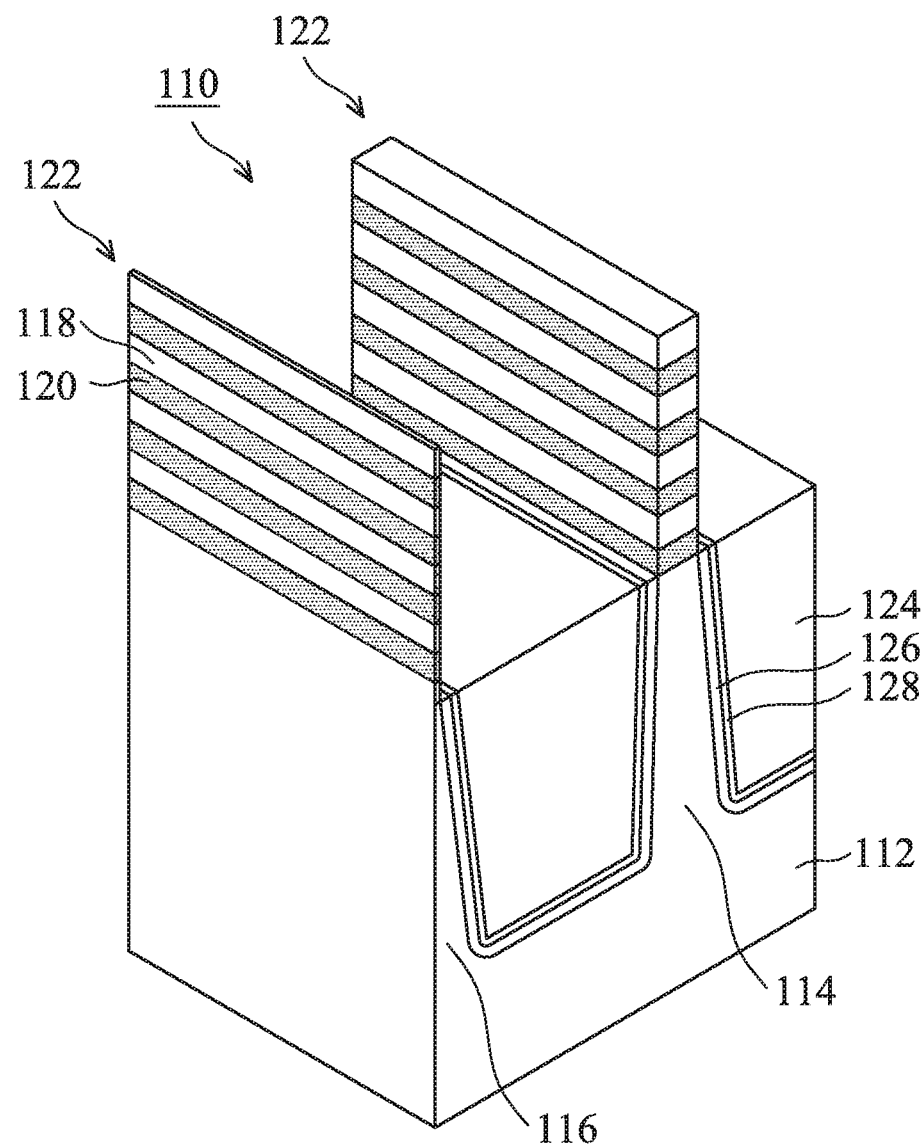
Figure 1C:
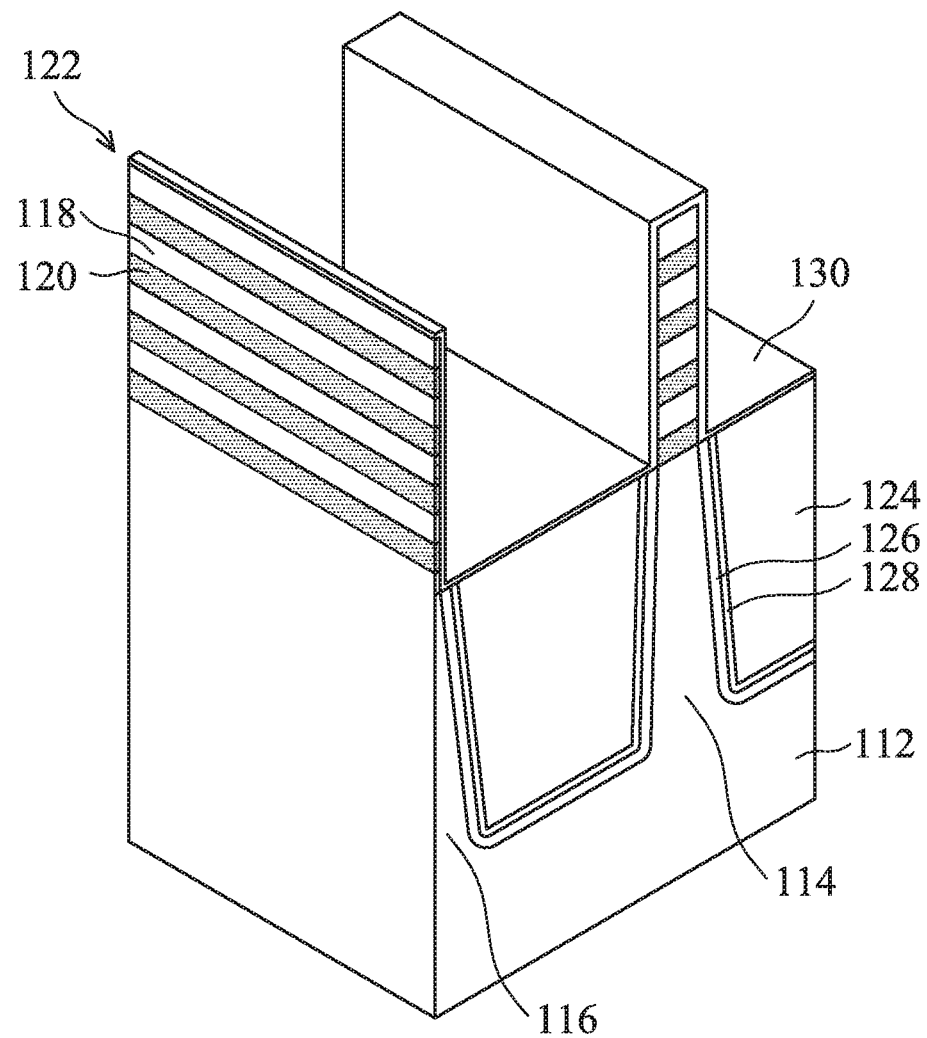
Figure 1D:
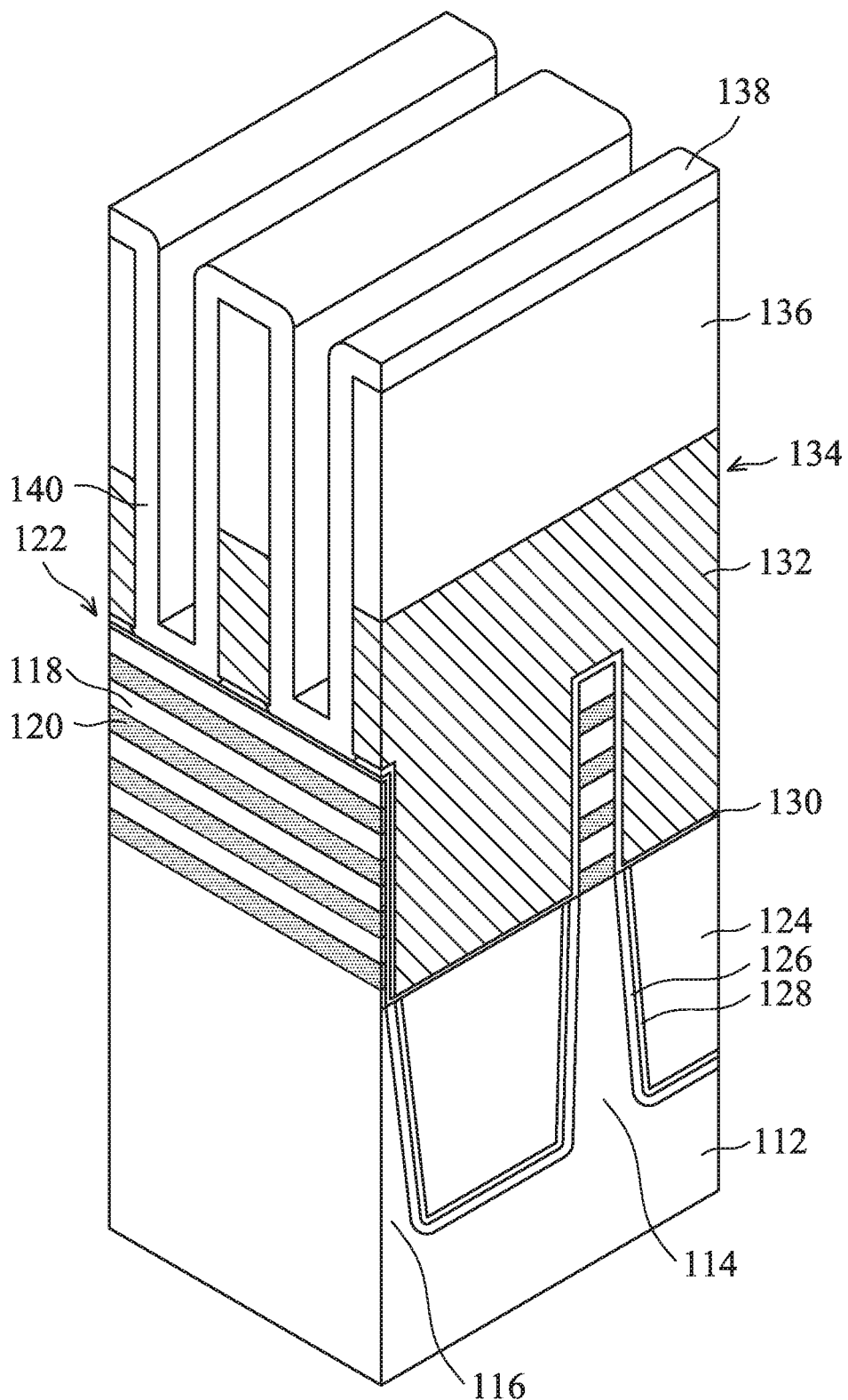
Figure 1E:
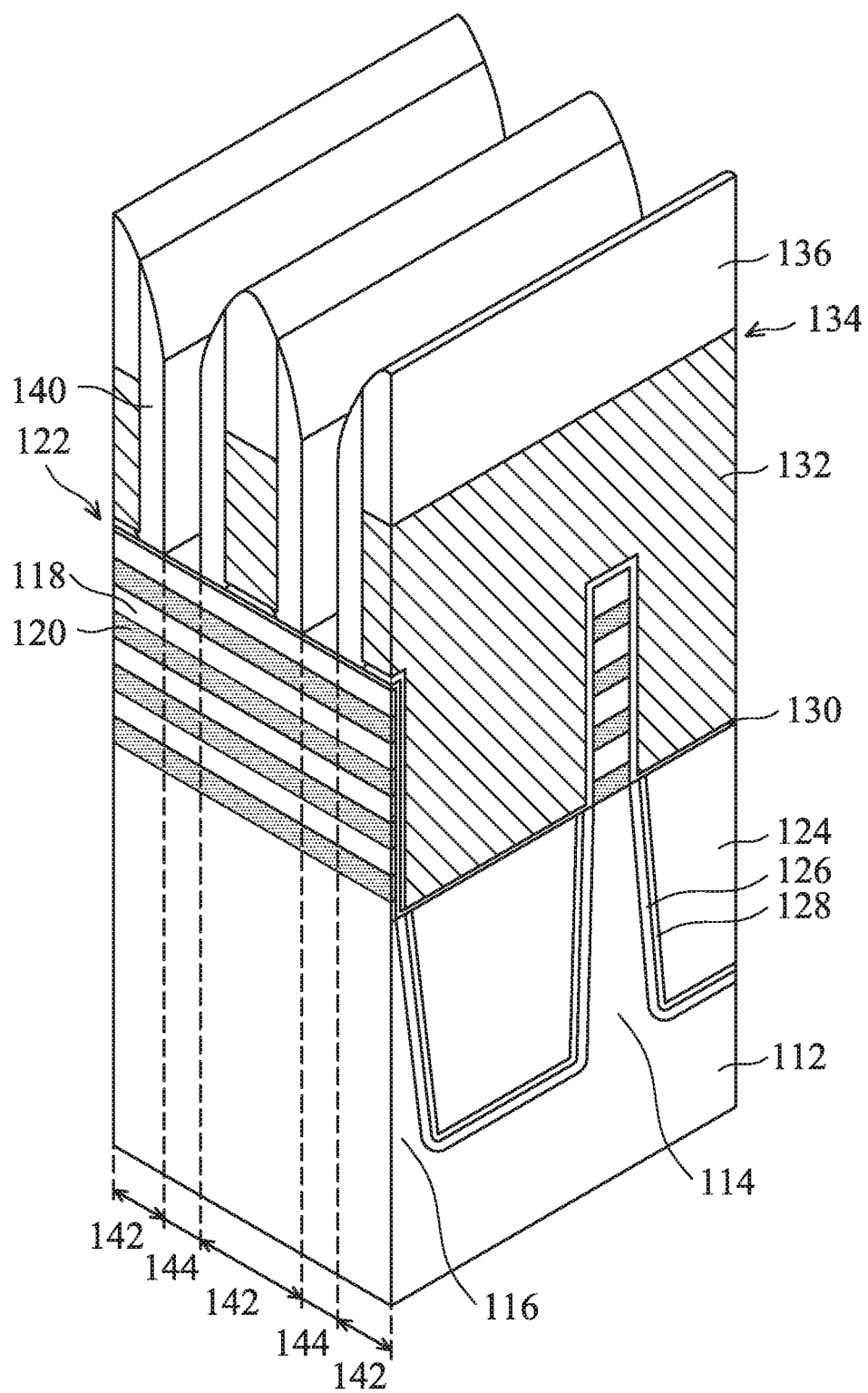
Figure 1F:
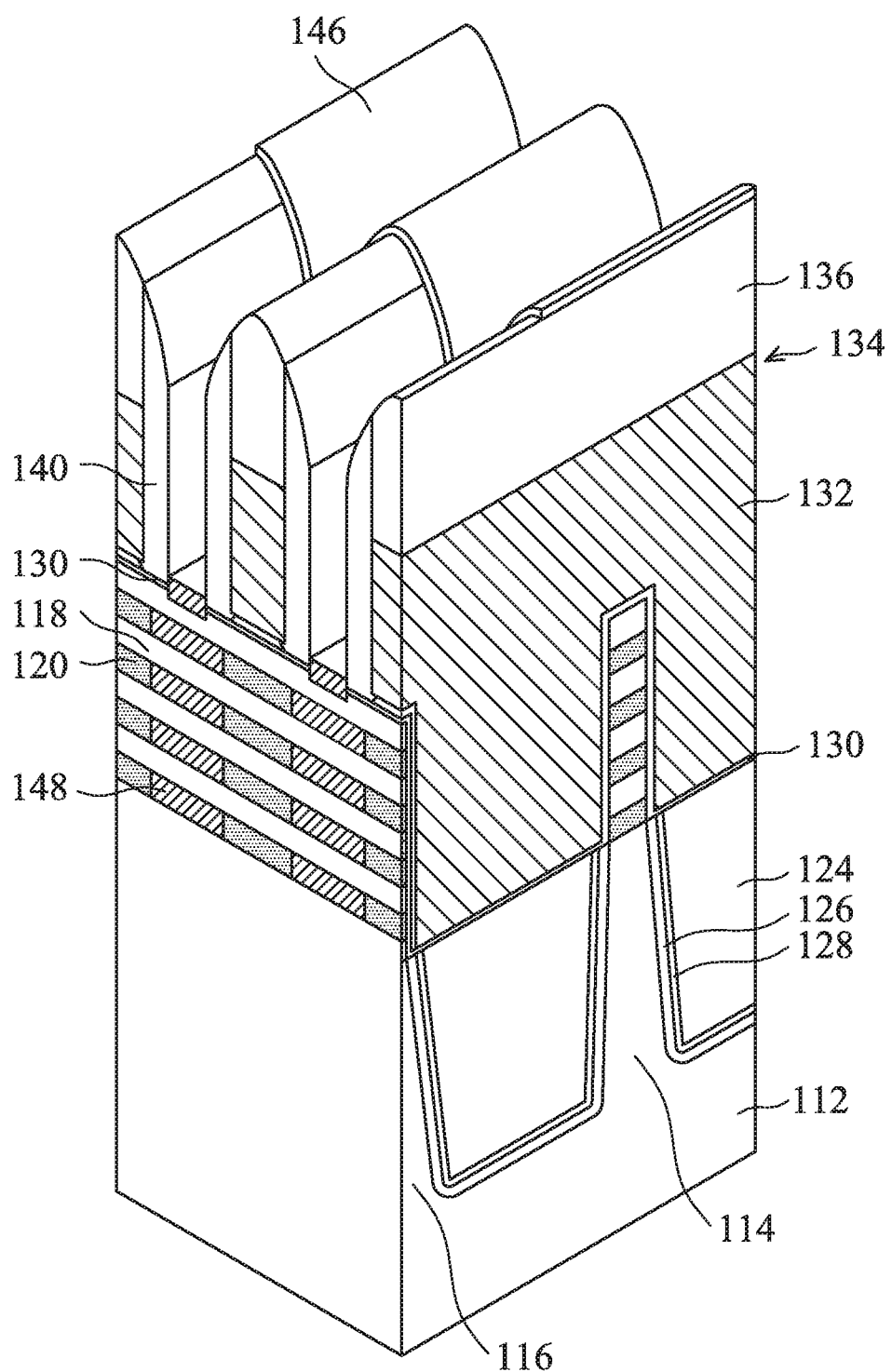
Figure 1G:
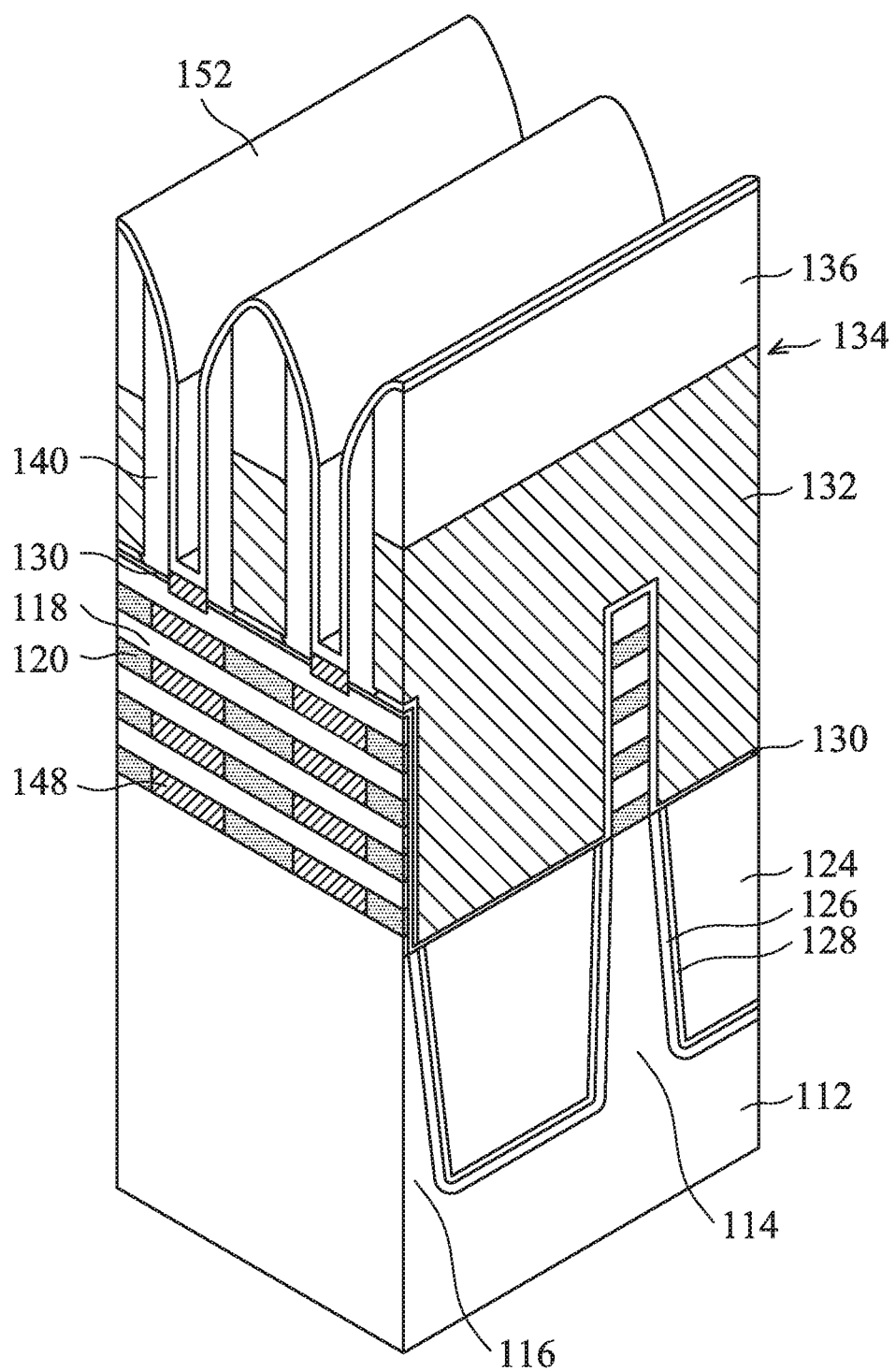
Figure 1H:
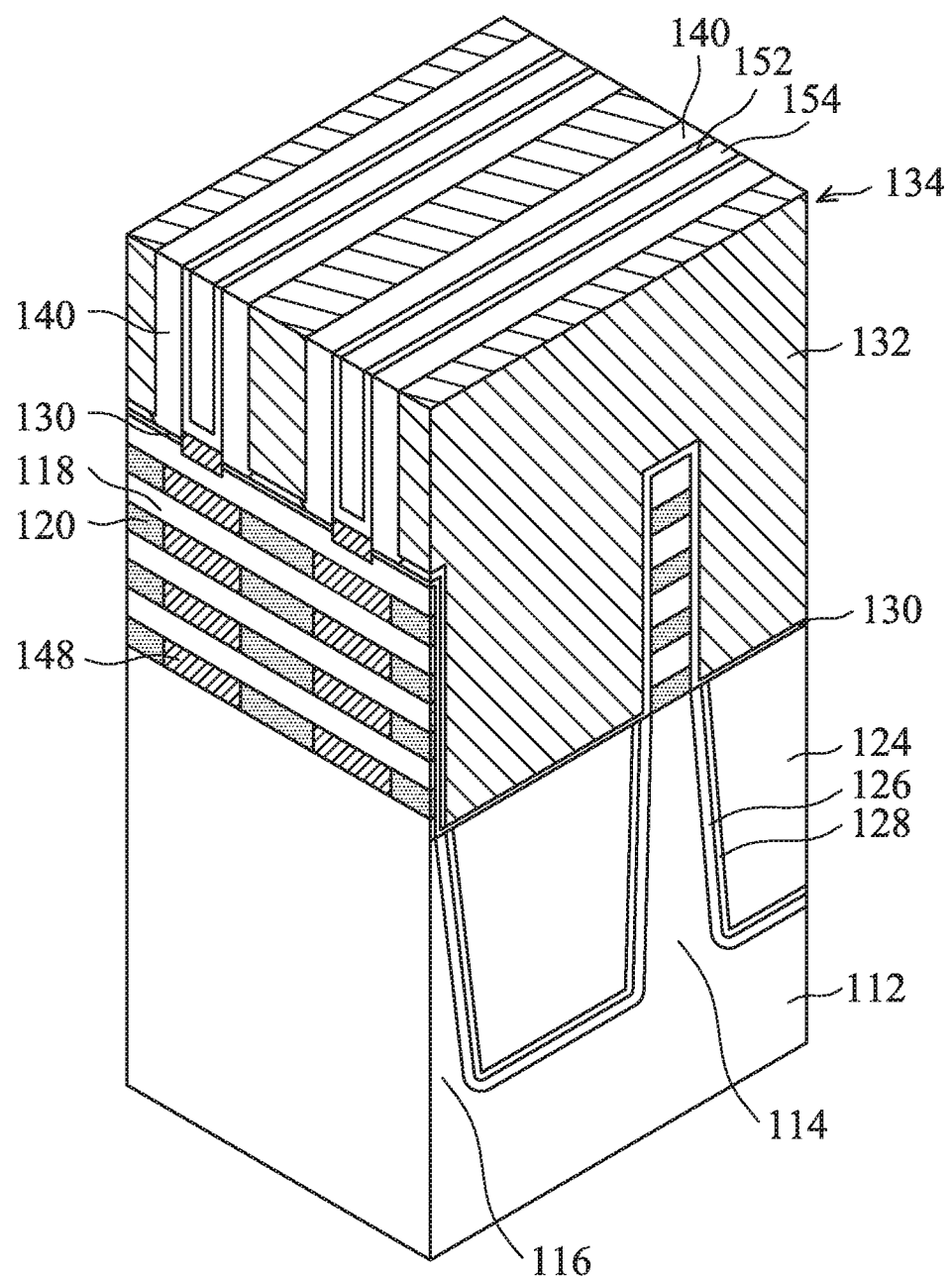
Figure 1I:
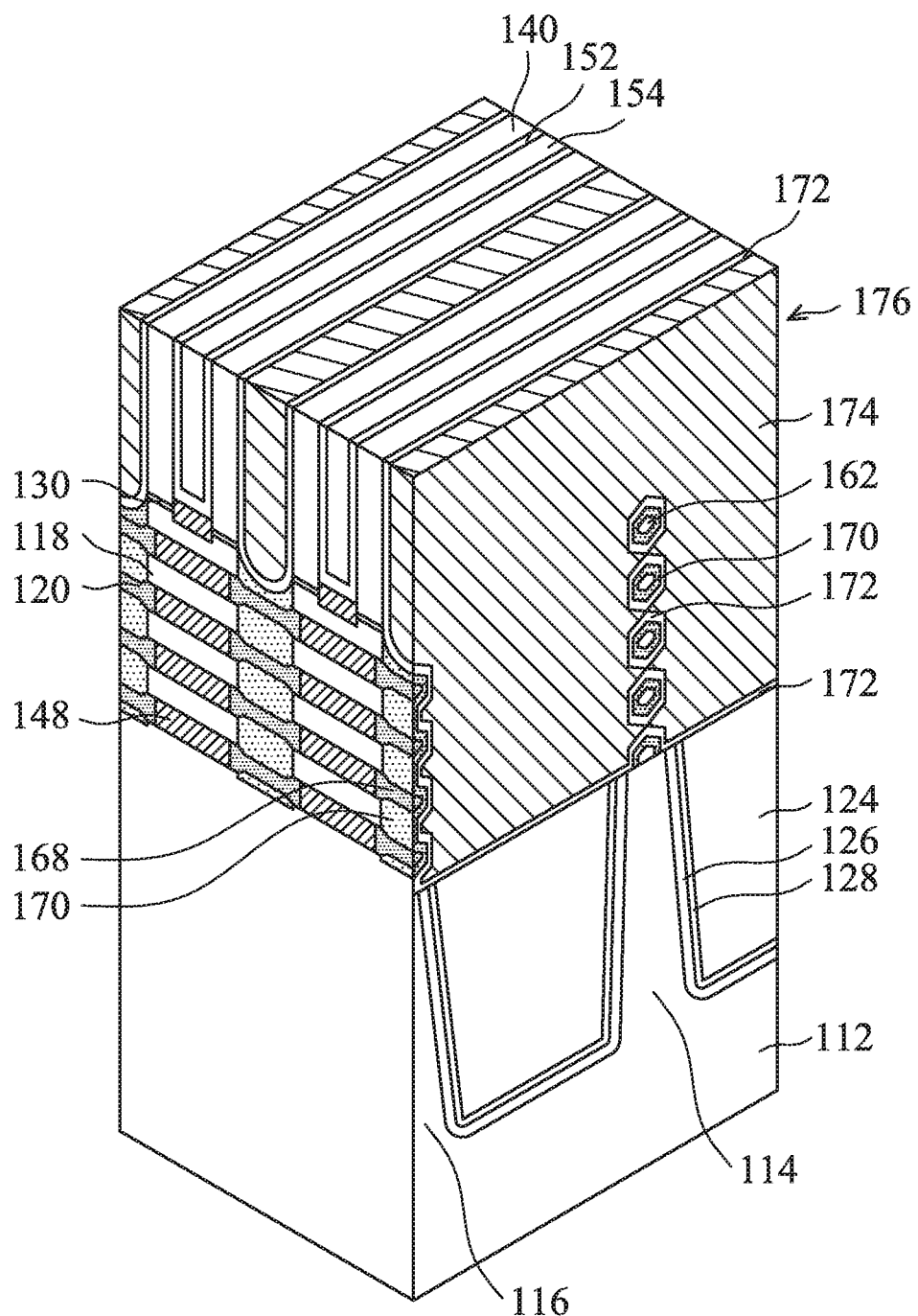
Figure 1J:
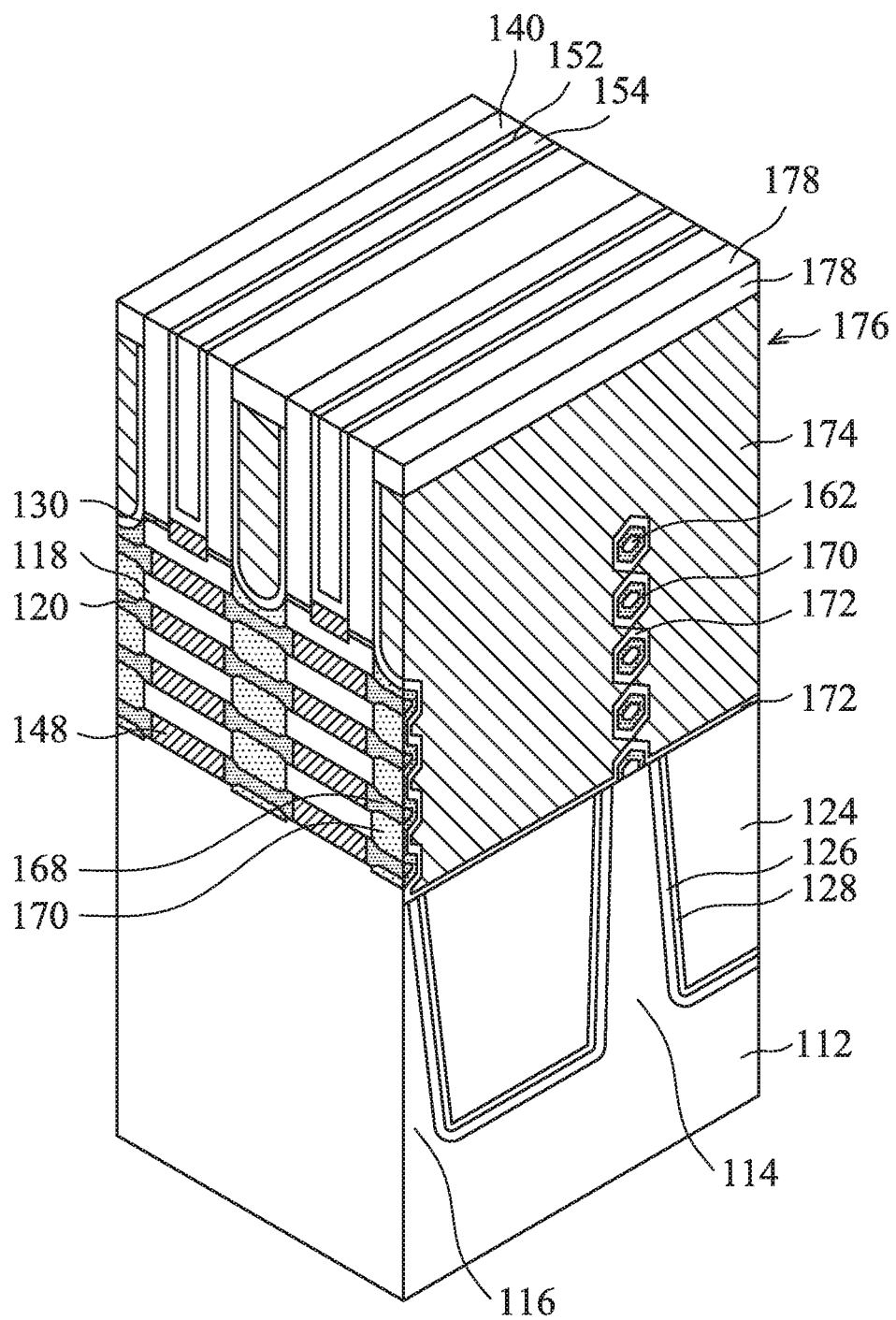
Figure 1K:
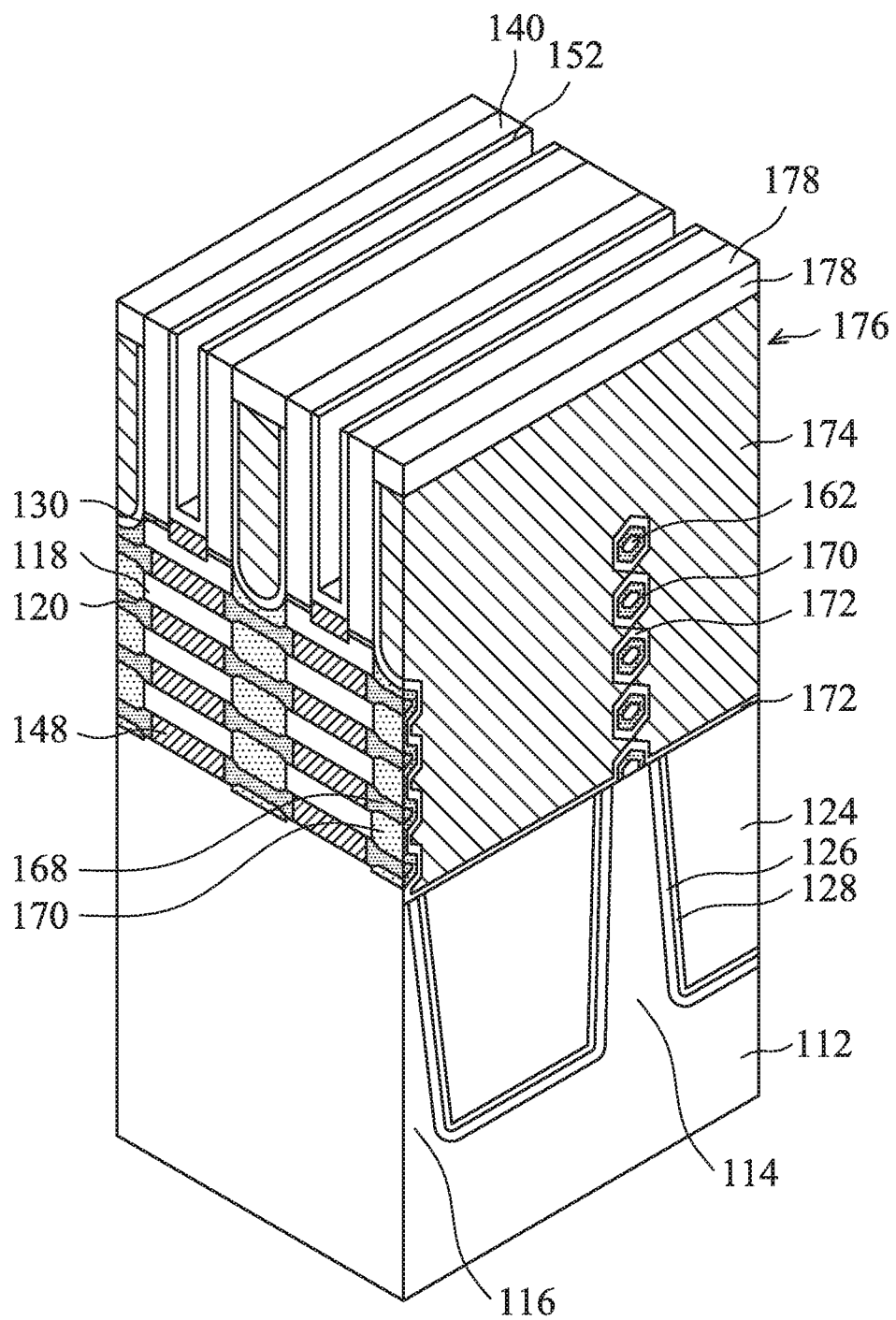
Figure 1L:
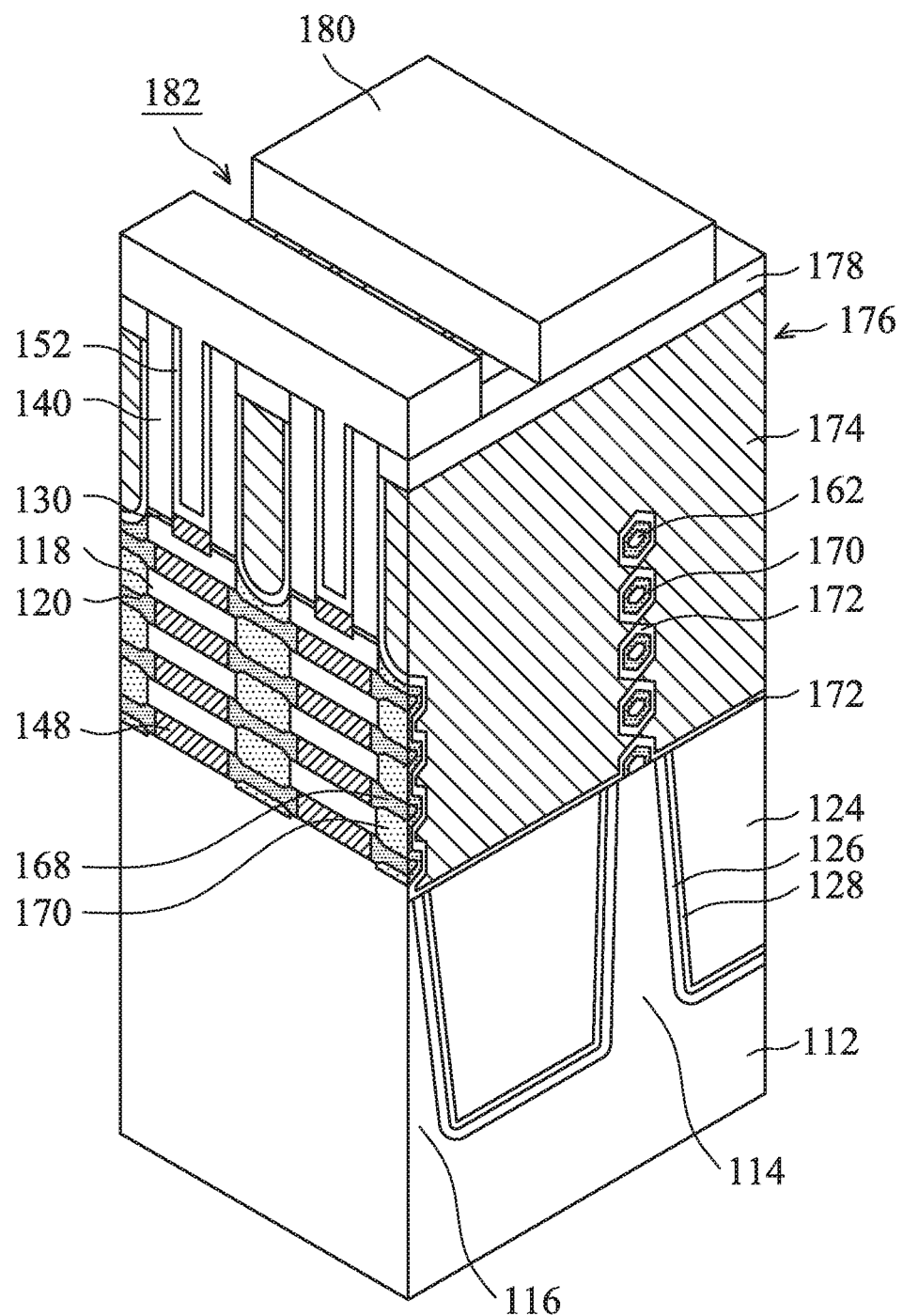
Figure 1M:
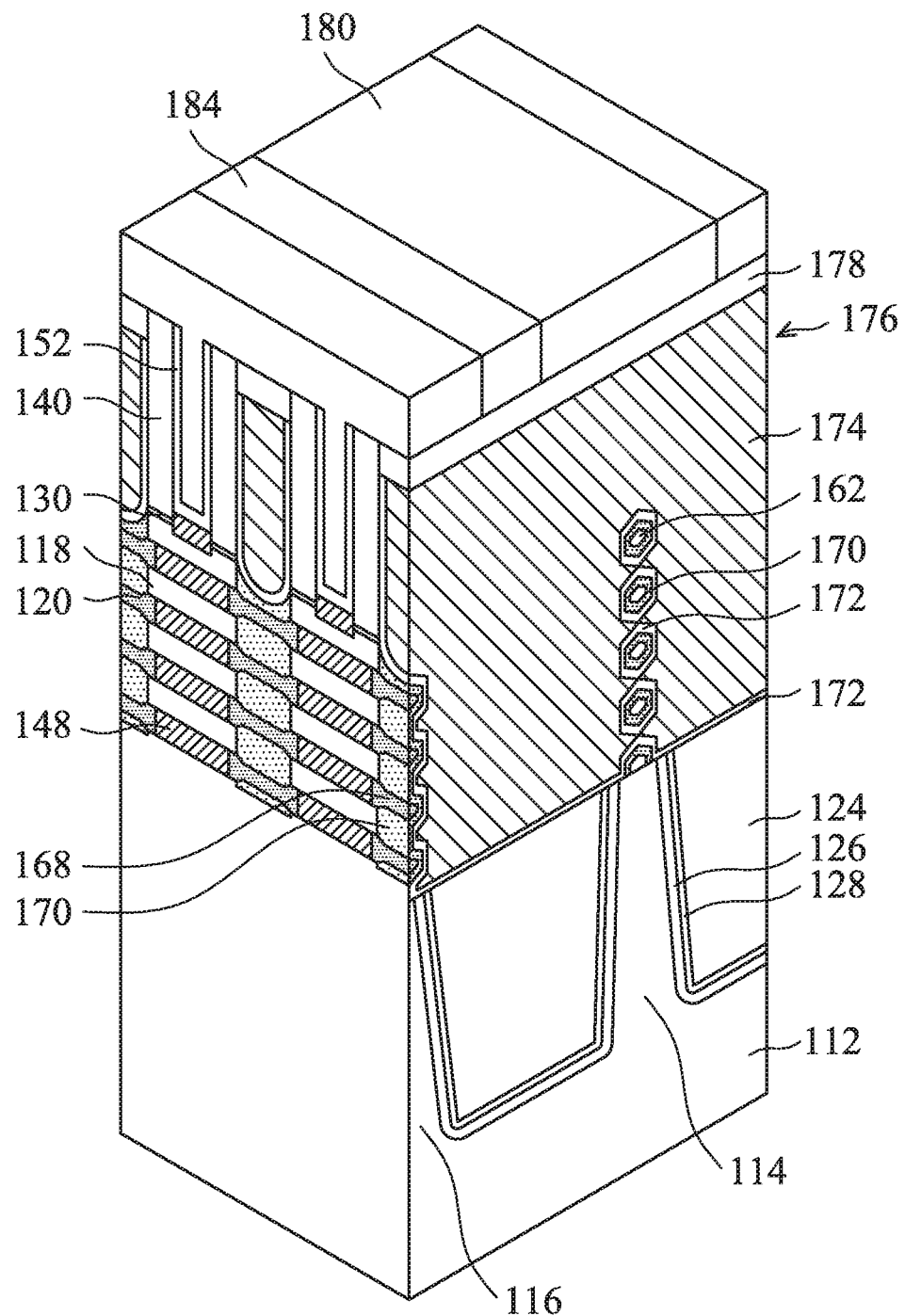
Figure 1N:
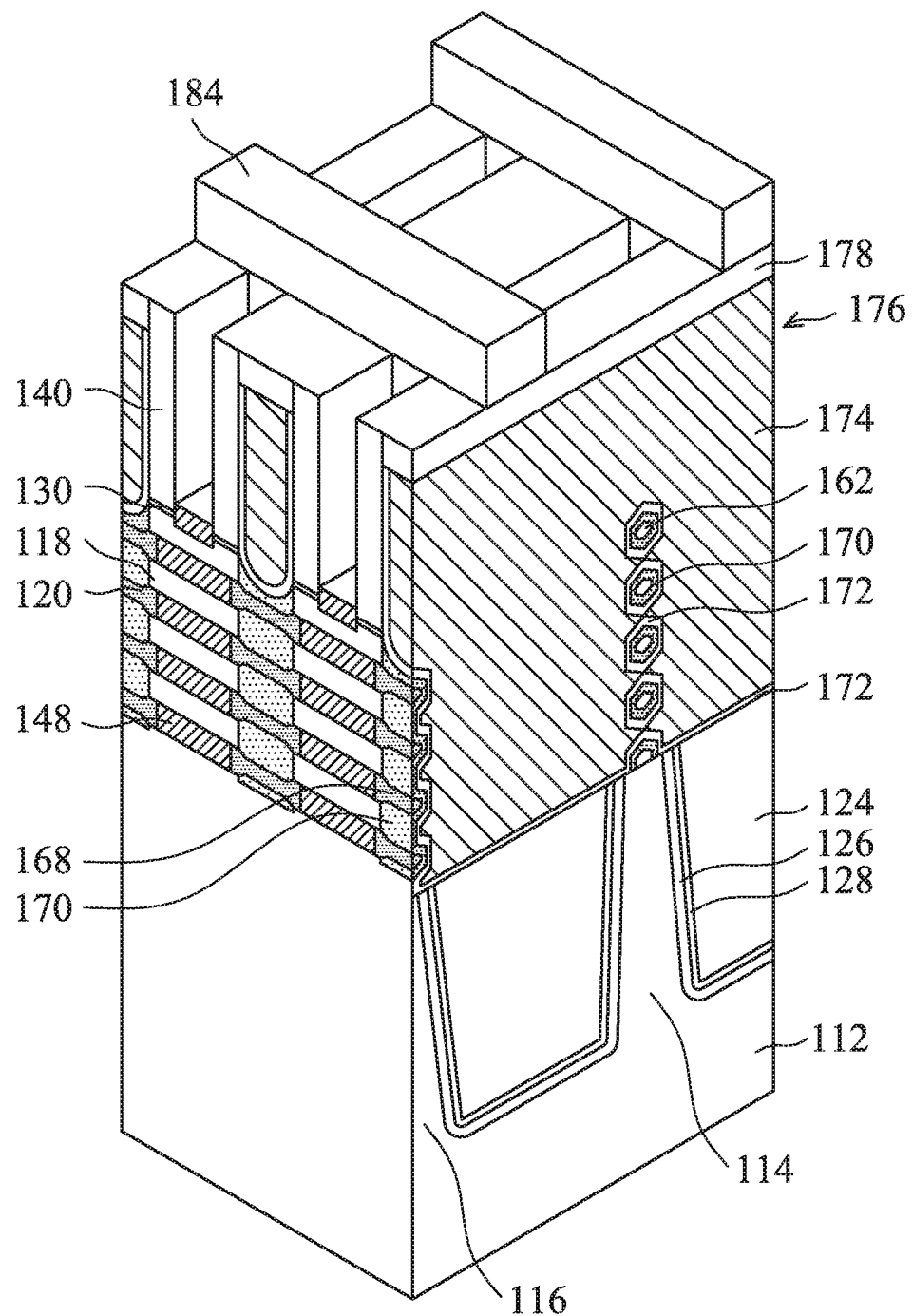
Figure 1O:
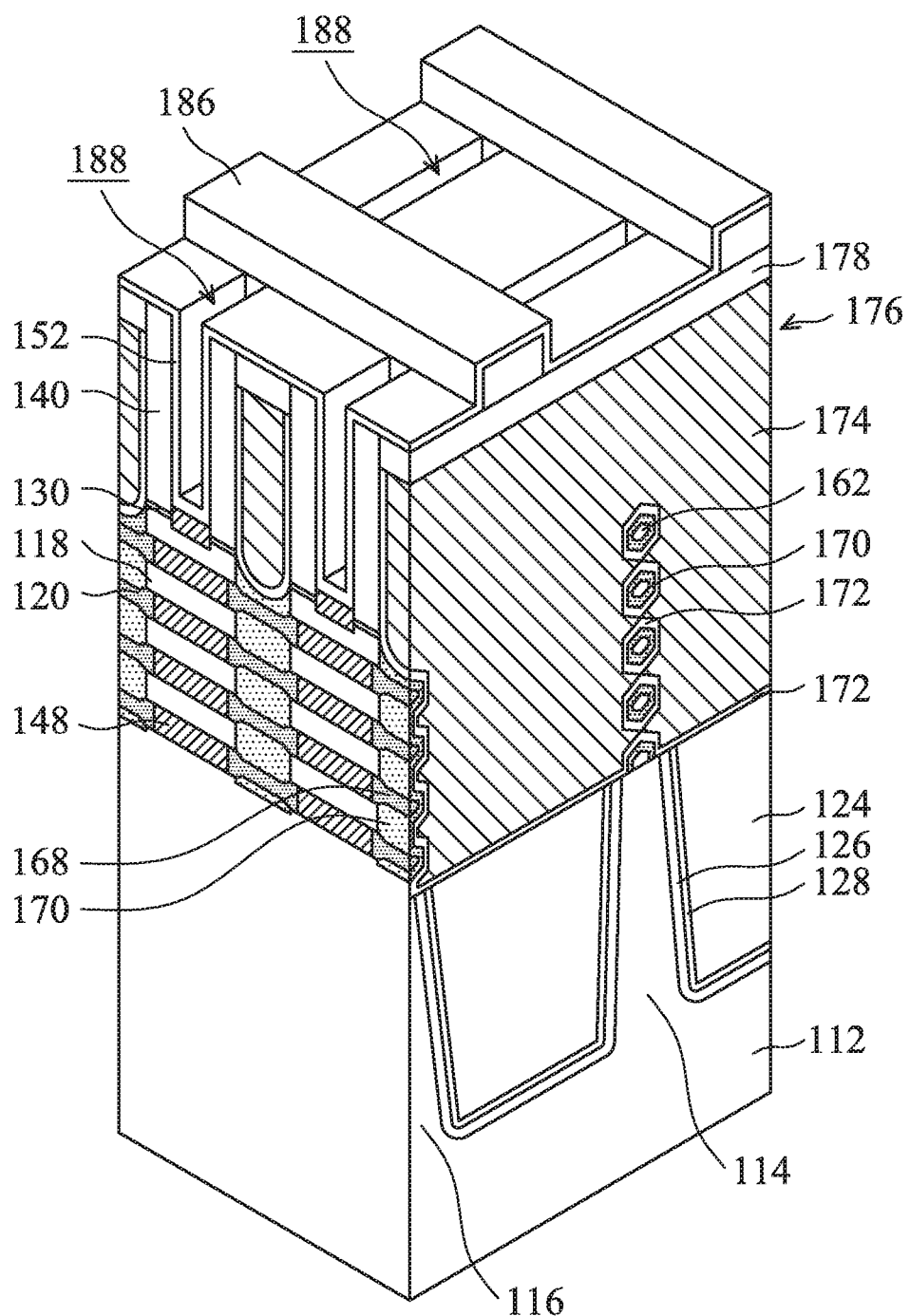
Figure 1P:
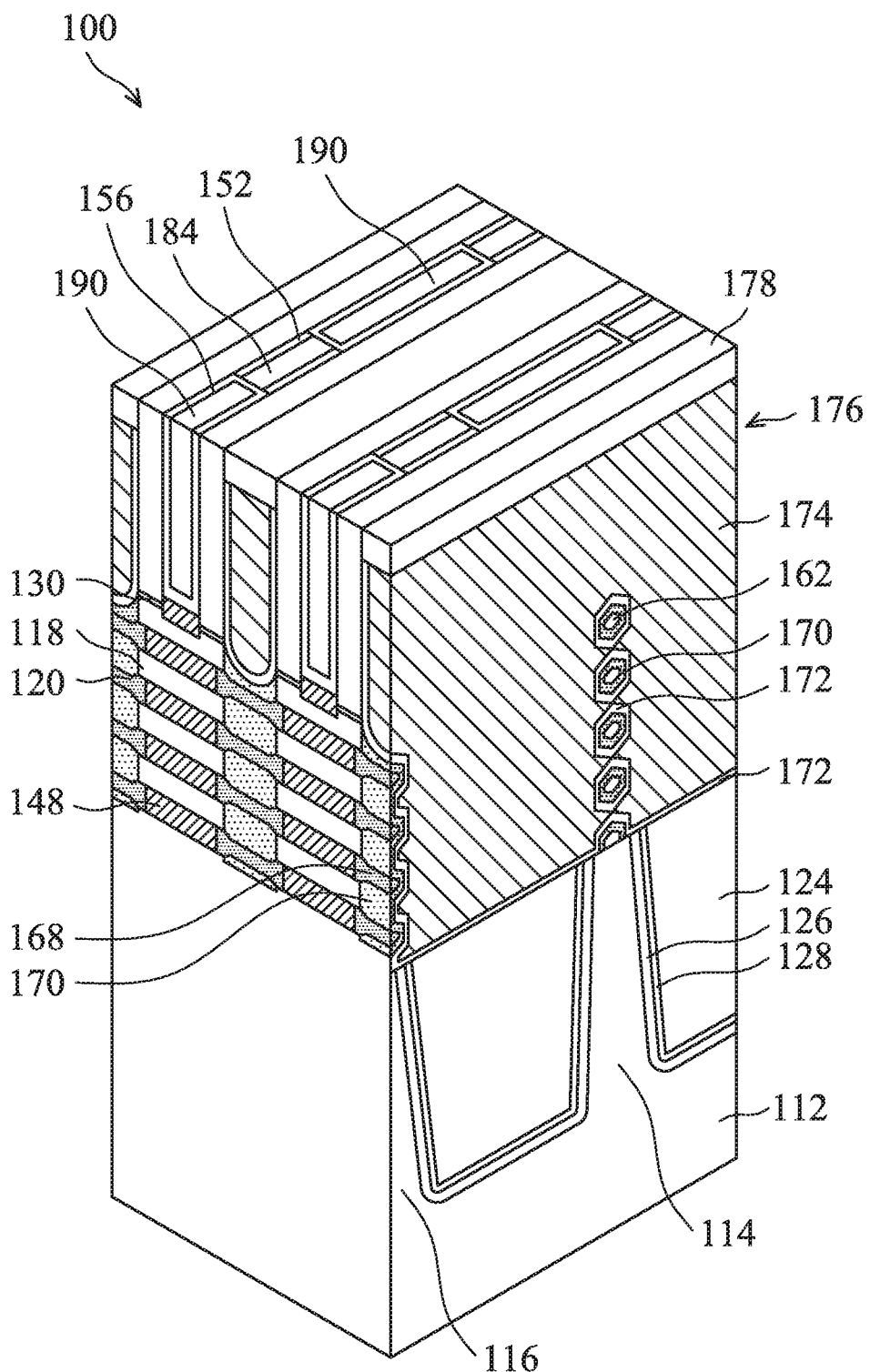

FIGS. 1A-1P are cross-sectional views of various stages of a process for forming a semiconductor device structure, in accordance with some embodiments. As shown in FIG. 1A, a semiconductor substrate 102 is received or provided, in accordance with some embodiments. In some embodiments, the semiconductor substrate 102 is a bulk semiconductor substrate, such as a semiconductor wafer. For example, the semiconductor substrate 102 is a silicon wafer. The semiconductor substrate 102 may include silicon or another elementary semiconductor material such as germanium. In some other embodiments, the semiconductor substrate 102 includes a compound semiconductor. The compound semiconductor may include gallium arsenide, silicon carbide, indium arsenide, indium phosphide, another suitable material, or a combination thereof.

In some embodiments, the semiconductor substrate 102 includes a semiconductor-on-insulator (SOI) substrate. The SOI substrate may be fabricated using a separation by implantation of oxygen (SIMOX) process, a wafer bonding process, another applicable method, or a combination thereof.

In some embodiments, the semiconductor substrate 102 is an un-doped substrate. However, in some other embodiments, the semiconductor substrate 102 is a doped substrate such as a P-type substrate or an N-type substrate.

In some embodiments, the semiconductor substrate 102 includes various doped regions (not shown) depending on design requirements of the semiconductor device. The doped regions include, for example, p-type wells and/or n-type wells. In some embodiments, the doped regions are doped with p-type dopants. For example, the doped regions are doped with boron or $BF_2$. In some embodiments, the doped regions are doped with n-type dopants. For example, the doped regions are doped with phosphor or arsenic. In some embodiments, some of the doped regions are p-type doped, and the other doped regions are n-type doped.

Still referring to FIG. 1A, a stacked-layer structure 104 is formed over the semiconductor substrate 102, in accordance with some embodiments. As shown in FIG. 1A, the stacked-layer structure 104 includes one or more of the first semiconductor material layers 106 and one or more of the second semiconductor material layers 108 alternately stacked vertically over the semiconductor substrate 102, in accordance with some embodiments. Although the stacked-layer structure 104 shown in FIG. 1A includes four second semiconductor material layers 108 and four first semiconductor material layers 106, the embodiments of the present disclosure are not limited thereto. In some other embodiments, the stacked-layer structure 104 includes one first semiconductor material layers 106 and one second semiconductor material layers 108 vertically stacked over the semiconductor substrate 102.

In some embodiments, the second semiconductor material layer 108 and the first semiconductor material layer 106 are independently made of silicon, silicon germanium, germanium tin, silicon germanium tin, gallium arsenide, indium gallium arsenide, indium arsenide, another suitable material, or a combination thereof. In some embodiments, the material of second semiconductor material layer 108 is different than the material of first semiconductor material layer 106. In some embodiments, the second semiconductor material layer 108 is made of silicon germanium, whereas the first semiconductor material layer 106 is made of silicon, and the semiconductor substrate 102 is made of silicon. In some embodiments, the second semiconductor material layer 108 is made of indium gallium arsenide, whereas the first semiconductor material layer 106 is made of gallium arsenide, and the semiconductor substrate 102 is made of gallium arsenide.

In some embodiments, the first semiconductor material layers 106 and the second semiconductor material layers 108 are formed using an epitaxial growth process. Each of the first semiconductor material layers 106 and the second semiconductor material layers 108 may be formed using a selective epitaxial growth (SEG) process, a chemical vapor deposition (CVD) process (e.g., a vapor-phase epitaxy (VPE) process, a low-pressure CVD (LPCVD) process, and/or an ultra-high vacuum CVD (UHV-CVD) process), a molecular beam epitaxy process, another applicable process, or a combination thereof. In some embodiments, the first semiconductor material layers 106 and the second semiconductor material layers 108 are grown in-situ in the same process chamber.

Afterwards, as shown in FIG. 1B, multiple recesses (or trenches) 110 are formed to pattern the first semiconductor material layers 106, the second semiconductor material layers 108, and the upper portion of the semiconductor substrate 102, in accordance with some embodiments. In some embodiments, multiple photolithography processes and etching processes are performed to form the recesses 110. The recess 110 may be used to separate two neighboring field effect transistors (FETs).

As a result, the patterned semiconductor substrate 102 includes a base portion 112, a first fin portion 114 over the base portion 112 and a second fin portion 116 over the base portion 112 and adjacent to each other, in accordance with some embodiments. As shown in FIG. 1B, the first fin portion 114 and the second fin portion 116 are between the recesses 110, in accordance with some embodiments.

As shown in FIG. 1B, the patterned first semiconductor material layers 106 and the patterned second semiconductor material layers 108 form the first semiconductor layers 118 and the second semiconductor layers 120 respectively, in accordance with some embodiments. In some embodiments, the first semiconductor layers 118 and the second semiconductor layers 120 form two stack structures 122 over the first fin portion 114 and the second fin portion 116 respectively. As shown in FIG. 1B, the first semiconductor layers 118 and the second semiconductor layers 120 of the stack structure 122 vertically stacked over the first fin portion 114 and/or the second fin portion 116, in accordance with some embodiments.

In some embodiments, the second semiconductor layer 120 and the first semiconductor layer 118 are independently made of silicon, silicon germanium, germanium tin, silicon germanium tin, gallium arsenide, indium gallium arsenide, indium arsenide, another suitable material, or a combination thereof. In some embodiments, the material of second semiconductor layer 120 is different than the material of first semiconductor layer 118. In some embodiments, the second semiconductor layer 120 is made of silicon germanium, whereas the first semiconductor layer 118 is made of silicon, and the semiconductor substrate 102 is made of silicon. In some embodiments, the second semiconductor layer 120 is made of indium gallium arsenide, whereas the first semiconductor layer 118 is made of gallium arsenide, and the semiconductor substrate 102 is made of gallium arsenide. In some embodiments, the thickness of the second semiconductor layer 120 is substantially equal to the thickness of the first semiconductor layer 118.

As shown in FIG. 1B, one or more isolation structures including an isolation structure 124 are formed over the semiconductor substrate 102 and formed in the recesses 110 to surround the first fin portion 114 and the second fin portion 116, in accordance with some embodiments. The isolation structure 124 is adjacent to the first fin portion 114 and the second fin portion 116. In some embodiments, the isolation structure 124 continuously surrounds the first fin portion 114 and the second fin portion 116.

The isolation structure 124 is used to define and electrically isolate various device elements formed in and/or over the semiconductor substrate 102. In some embodiments, the isolation structure 124 includes a shallow trench isolation (STI) feature, a local oxidation of silicon (LOCOS) feature, another suitable isolation structure, or a combination thereof.

In some embodiments, the isolation structure 124 has a multi-layer structure. In some embodiments, the isolation structure 124 is made of a dielectric material. The dielectric material may include silicon oxide, silicon nitride, silicon oxynitride, fluoride-doped silicate glass (FSG), low-K dielectric material, another suitable material, or a combination thereof. In some embodiments, a first STI liner 126 and a second STI liner 128 are formed to reduce crystalline defects at the interface between the semiconductor substrate 102 and the isolation structure 124. In some embodiments of the present disclosure, the first STI liner 126 is formed over the sidewalls of the first fin portion 114 and the second fin portion 116 and over the base portion 112, and the second STI liner 128 is formed over the first STI liner 126. The first STI liner 126 and the second STI liner 128 may also be used to reduce crystalline defects at the interface between the fin portions 106 and the isolation structure 124.

In some embodiments, two STI liner material layers and a dielectric layer is deposited to cover the semiconductor substrate 102 and the stack structure 122 using a chemical vapor deposition (CVD) process, a spin-on process, another applicable process, or a combination thereof. The chemical vapor deposition may include, but is not limited to, low pressure chemical vapor deposition (LPCVD), low temperature chemical vapor deposition (LTCVD), rapid thermal chemical vapor deposition (RTCVD), plasma enhanced chemical vapor deposition (PECVD), atomic layer deposition (ALD), or any other suitable method. The dielectric layer covers the first fin portion 114 and the second fin portion 116 and fills the recesses 110 between the fin portions 106.

Afterwards, in some embodiments, a planarization process is performed to thin down the two STI liner material layers and the dielectric layer. For example, the dielectric layer is thinned until the stack structure 122 is exposed. The planarization process may include a chemical mechanical polishing (CMP) process, a grinding process, a dry polishing process, an etching process, another applicable process, or a combination thereof. Afterwards, the two STI liner material layers and the dielectric layer are etched back to be below the top of the stack structure 122. As a result, the first STI liner 126, the second STI liner 128 and the isolation structure 124 are formed.

Afterwards, as shown in FIG. 1C, a dummy gate dielectric layer 130 is deposited covering the stack structure 122 and the isolation structure 124, in accordance with some embodiments.

In some embodiments, the dummy gate dielectric layer 130 is made of silicon oxide, silicon nitride, silicon oxynitride, the high-k material, another suitable dielectric material, or a combination thereof. In some embodiments, the high-k material may include, but is not limited to, metal oxide, metal nitride, metal silicide, transition metal oxide, transition metal nitride, transition metal silicide, transition metal oxynitride, metal aluminate, zirconium silicate, zirconium aluminate. For example, the material of the high-k material may include, but is not limited to, LaO, AlO, ZrO, TiO, $Ta_2O_5$, $Y_2O_3$, $SrTiO_3$(STO), $BaTiO_3$(BTO), BaZrO, $HfO_2$, $HfO_3$, HfZrO, HfLaO, HfSiO, HfSiON, LaSiO, AlSiO, HfTaO, HfTiO, HfTaTiO, HfAlON, $(Ba,Sr)TiO_3$ (BST), $Al_2O_3$, another suitable high-k dielectric material, or a combination thereof.

In some embodiments, the applicable deposition methods for depositing the dummy gate dielectric layer 130 include a chemical vapor deposition (CVD) process, an atomic layer deposition (ALD) process, a thermal oxidation process, a spin-on coating process, other applicable processes, and combinations thereof.

Afterwards, as shown in FIG. 1D, a dummy gate electrode 132 is formed over the dummy gate dielectric layer 130, in accordance with some embodiments.

In some embodiments, the dummy gate electrode 132 is made of polysilicon, a metal material, another suitable conductive material, or a combination thereof. In some embodiments, the metal material may include, but is not limited to, copper, aluminum, tungsten, molybdenum, titanium, tantalum, platinum, or hafnium. In some embodiments, the dummy gate electrode 132 will be replaced with another conductive material such as a metal material in subsequent processes.

Still referring to FIG. 1D, a mask element 136 is formed over the dummy gate electrode 132, in accordance with some embodiments. In some embodiments, the mask element 136 is made of silicon oxide, silicon nitride, silicon oxynitride or another suitable material.

In some embodiments of the present disclosure, a gate electrode material layer (not shown) is deposited over the dummy gate dielectric layer 130. In some embodiments the gate electrode material layer is deposited by using applicable deposition methods.

In some embodiments, the applicable deposition methods for depositing the gate electrode material layer include a chemical vapor deposition (CVD) process, a physical vapor deposition (PVD) process, and other applicable methods.

Afterwards, according to some embodiments of the present disclosure, the mask element 136 is formed over the dummy gate electrode 132, in accordance with some embodiments. In some embodiments, the applicable deposition methods for depositing the mask element 136 include a chemical vapor deposition (CVD) process, an atomic layer deposition (ALD) process, a thermal oxidation process, a spin-on coating process, other applicable processes, and combinations thereof.

Afterwards, according to some embodiments of the present disclosure, by using the mask element 136 as an etching mask, the gate electrode material layer is patterned to form the dummy gate electrode 132.

As shown in FIG. 1D, the dummy gate dielectric layer 130 and the dummy gate electrode 132 form a dummy gate structure 134, in accordance with some embodiments. As shown in FIG. 1D, the dummy gate structure 134 covers a portion of the stack structure 122, in accordance with some embodiments. As shown in FIG. 1D, the dummy gate structure 134 exposes another portion of the stack structure 122, in accordance with some embodiments.

In some embodiments, a spacer layer 138 is deposited over the semiconductor substrate 102, the stack structure 122, the dummy gate structure 134 and the mask element 136. In some embodiments, the spacer layer 138 is made of silicon nitride, silicon oxynitride, silicon carbide, another suitable material, or a combination thereof. The spacer layer 138 may be deposited using a CVD process, a PVD process, a spin-on coating process, another applicable process, or a combination thereof.

Afterwards, as shown in FIG. 1E, an etching process, such as an anisotropic etching process, is performed to partially remove the spacer layer 138. As a result, the remaining portions of the spacer layer 138 over the sidewalls of the dummy gate structure 134 form the spacer elements 140. As shown in FIG. 1E, the spacer elements 140 are formed over sidewalls of the dummy gate structure 134, in accordance with some embodiments. In some embodiments, the spacer elements 140 are made of silicon nitride, silicon oxynitride, silicon carbide, another suitable material, or a combination thereof.

Still referring to FIG. 1E, the first fin portion 114 and the second fin portion 116 has channel regions 142 and source/drain regions 144, in accordance with some embodiments. As shown in FIG. 1E, the channel regions 142 are the regions covered by the dummy gate structure 134 and the spacer elements 140, in accordance with some embodiments. As shown in FIG. 1E, the source/drain regions 144 are the regions exposed by the dummy gate structure 134 and the spacer elements 140, in accordance with some embodiments.

In some embodiments of the present disclosure, the spacer elements 140 expose the stack structures 122 in the source/drain regions 144, in accordance with some embodiments.

Afterwards, as shown in FIG. 1F, a mask element 146 is formed over the dummy gate structure 134, the spacer elements 140, the mask element 136 and the stack structures 122 which are over the first fin portion 114, in accordance with some embodiments. As shown in FIG. 1F, the mask element 146 exposes the stack structures 122 over the second fin portion 116, in accordance with some embodiments.

Afterwards, as shown in FIG. 1F, an etching process, such as an anisotropic etching process, is performed to remove the second semiconductor layers 120 over the second fin portion 116 in the source/drain regions 144 and form spaces between the first semiconductor layers 118, in accordance with some embodiments. As shown in FIG. 1F, the second semiconductor layers 120 over the second fin portion 116 in the channel regions 142 remain, in accordance with some embodiments.

Afterwards, as shown in FIG. 1F, source/drain portions 148 are formed in the stack structure 122 in the source/drain region 144 over the second fin portion 116, in accordance with some embodiments. As shown in FIG. 1F, the source/drain portions 148 are between the second semiconductor layers 120 in the channel regions 142, in accordance with some embodiments. As shown in FIG. 1F, the source/drain portions 148 are adjacent to the second semiconductor layers 120 in the channel regions 142, in accordance with some embodiments.

In some embodiments, the source/drain portions 148 are an n-type semiconductor material. The source/drain portions 148 may include epitaxially grown silicon, epitaxially grown silicon phosphide (SiP), or another applicable epitaxially grown semiconductor material. The source/drain portions 148 are not limited to being an n-type semiconductor material. In some other embodiments, the source/drain portions 148 are made of a p-type semiconductor material. For example, the source/drain portions 148 may include epitaxially grown silicon germanium.

In some embodiments, a semiconductor material is epitaxially grown in the space between the first semiconductor layers 118 to form the source/drain portions 148 over the second fin portion 116. In some embodiments, the source/drain portions 148 are formed by using a selective epitaxial growth (SEG) process, a CVD process (e.g., a vapor-phase epitaxy (VPE) process, a low pressure chemical vapor deposition (LPCVD) process, and/or an ultra-high vacuum CVD (UHV-CVD) process), a molecular beam epitaxy process, another applicable process, or a combination thereof.

Afterwards, the mask element 146 is removed, in accordance with some embodiments. Afterwards, other source/drain portions 150 are formed over the first fin portion 114 by a process that is similar to the one mentioned above, in accordance with some embodiments. It should be noted that the source/drain portions 150 are not shown in FIG. 1F, but are shown in FIG. 4A. As shown in FIG. 4A, source/drain portions 150 are formed in the stack structure 122 in the source/drain region 144 over the first fin portion 114, in accordance with some embodiments. As shown in FIG. 4A, the source/drain portions 150 are between the first semiconductor layers 118 in the channel regions 142, in accordance with some embodiments. As shown in FIG. 4A, the source/drain portions 150 are adjacent to the first semiconductor layers 118 in the channel regions 142, in accordance with some embodiments.

In some embodiments, the source/drain portions 150 are an n-type semiconductor material. The source/drain portions 150 may include epitaxially grown silicon, epitaxially grown silicon phosphide (SiP), or another applicable epitaxially grown semiconductor material. The source/drain portions 150 are not limited to being an n-type semiconductor material. In some other embodiments, the source/drain portions 150 are made of a p-type semiconductor material. For example, the source/drain portions 150 may include epitaxially grown silicon germanium.

In some embodiments, a mask element (not shown) is formed to cover the stack structures 122 over the second fin portion 116 and to expose the stack structures 122 over the first fin portion 114, in accordance with some embodiments. Afterwards, an etching process, such as an anisotropic etching process, is performed to remove the first semiconductor layers 118 over the first fin portion 114 in the source/drain regions 144 and to form spaces between the second semiconductor layers 120, in accordance with some embodiments.

Afterwards, in some embodiments, a semiconductor material is epitaxially grown in the space between the second semiconductor layers 120 to form the source/drain portions 150 over the first fin portion 114. In some embodiments, the source/drain portions 150 are formed by using a selective epitaxial growth (SEG) process, a CVD process (e.g., a vapor-phase epitaxy (VPE) process, a low pressure chemical vapor deposition (LPCVD) process, and/or an ultra-high vacuum CVD (UHV-CVD) process), a molecular beam epitaxy process, another applicable process, or a combination thereof.

Afterwards, as shown in FIG. 1G, an etch stop layer 152 is conformally deposited over the dummy gate structure 134, the spacer elements 140, the mask element 136 and the stack structures 122, in accordance with some embodiments.

In some embodiments, the etch stop layer 152 is made of silicon nitride, silicon oxynitride, silicon carbide, another suitable material, or a combination thereof. In some embodiments, the applicable deposition methods for depositing the etch stop layer 152 includes a chemical vapor deposition (CVD) process, an atomic layer deposition (ALD) process, a spin-on coating process, other applicable processes, and combinations thereof.

Afterwards, as shown in FIG. 1H, an interlayer dielectric layer 154 is subsequently formed over the etch stop layer 152, in accordance with some embodiments. In some embodiments, the interlayer dielectric layer 154 is made of silicon oxide, silicon oxynitride, borosilicate glass (BSG), phosphoric silicate glass (PSG), borophosphosilicate glass (BPSG), fluorinated silicate glass (FSG), low-k material, porous dielectric material, another suitable material, or a combination thereof. In some embodiments, the interlayer dielectric layer 154 is deposited using a CVD process, an ALD process, a spin-on process, a spray coating process, another applicable process, or a combination thereof.

In some embodiments, a dielectric layer is deposited over the etch stop layer 152 using a chemical vapor deposition (CVD) process, a spin-on process, another applicable process, or a combination thereof. In some embodiments, a planarization process is performed to thin down the dielectric layer. For example, the dielectric layer is thinned until the dummy gate electrode 132 is exposed. The planarization process may include a chemical mechanical polishing (CMP) process, a grinding process, a dry polishing process, an etching process, another applicable process, or a combination thereof. As a result, the interlayer dielectric layer 154 and the structure shown in FIG. 1H are formed.

Figure 2A:
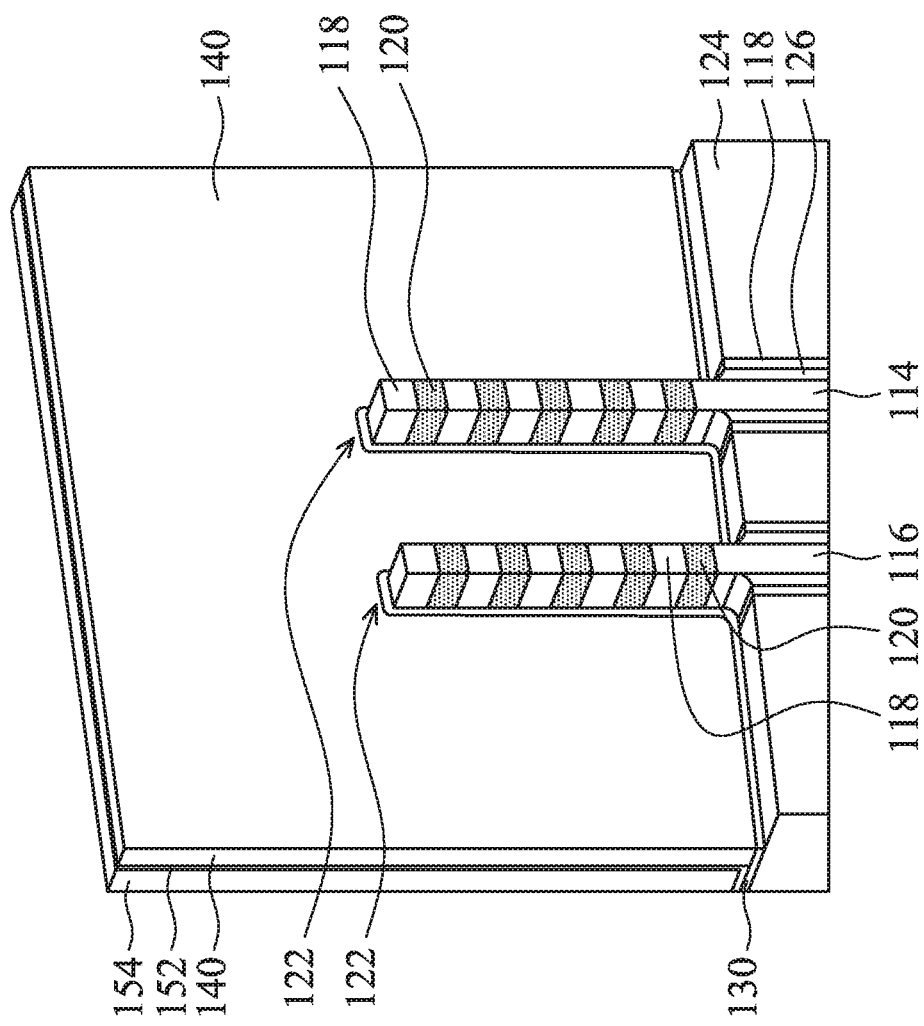
FIGS. 2A-2C are schematic views of various stages of a process for forming a semiconductor device structure, in accordance with some embodiments.

Afterwards, one or more first nanowires and one or more second nanowires are formed, in accordance with some embodiments. As shown in FIGS. 2A and 4A, the dummy gate structure 134 in the channel regions shown in FIG. 1E is removed, in accordance with some embodiments. As shown in FIGS. 2A and 4A, the first semiconductor layers 118 and the second semiconductor layers 120 of the stack structure 122 in the channel regions are exposed, in accordance with some embodiments.

Figure 2B:
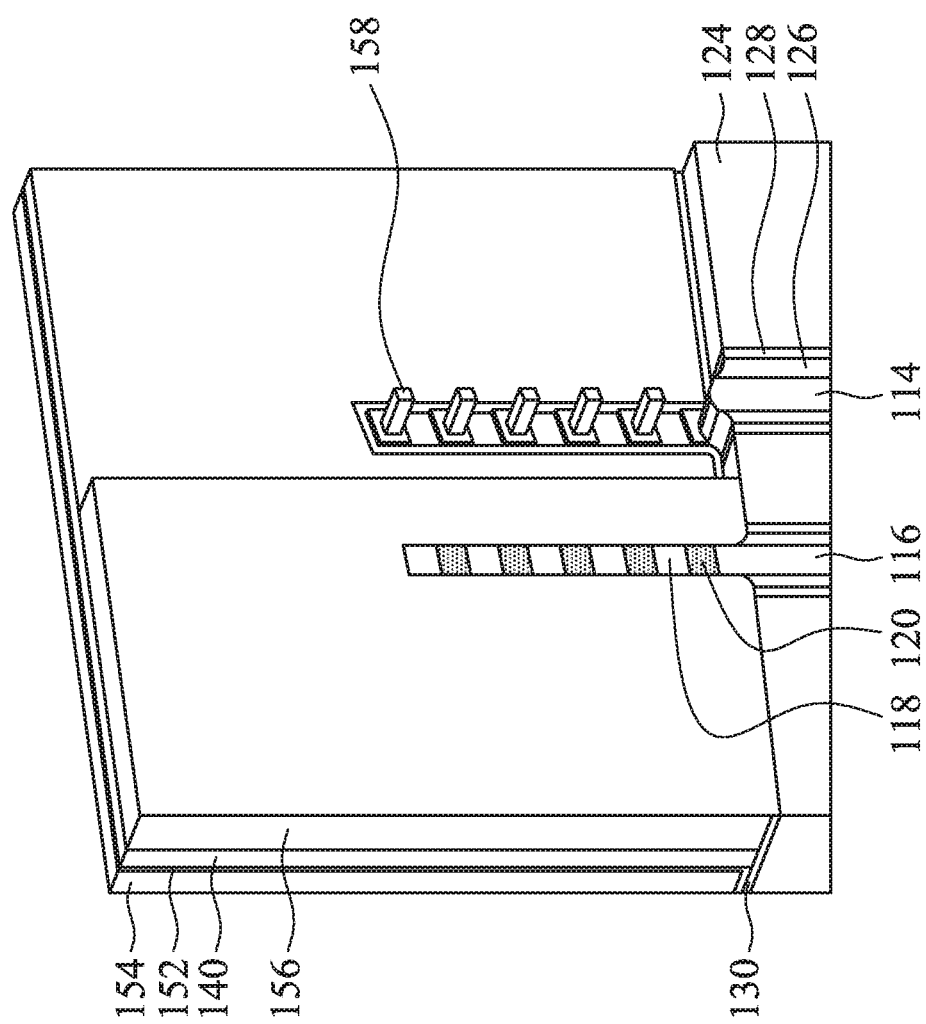

Afterwards, as shown in FIGS. 2B and 4B, a mask element 156 is formed to cover the stack structure 122 over the second fin portion 116, in accordance with some embodiments. As shown in FIGS. 2B and 4B, the mask element 156 exposes the stack structure 122 over the first fin portion 114, in accordance with some embodiments.

Afterwards, as shown in FIGS. 2B and 4B, an etching process, such as an anisotropic etching process, is performed to remove the second semiconductor layers 120 over the first fin portion 114 in the channel regions, in accordance with some embodiments. As shown in FIGS. 2B and 4B, the remaining portion of the first semiconductor layers 118 over the first fin portion 114 in the channel regions form semiconductor material wires 158, in accordance with some embodiments.

Figure 2C:
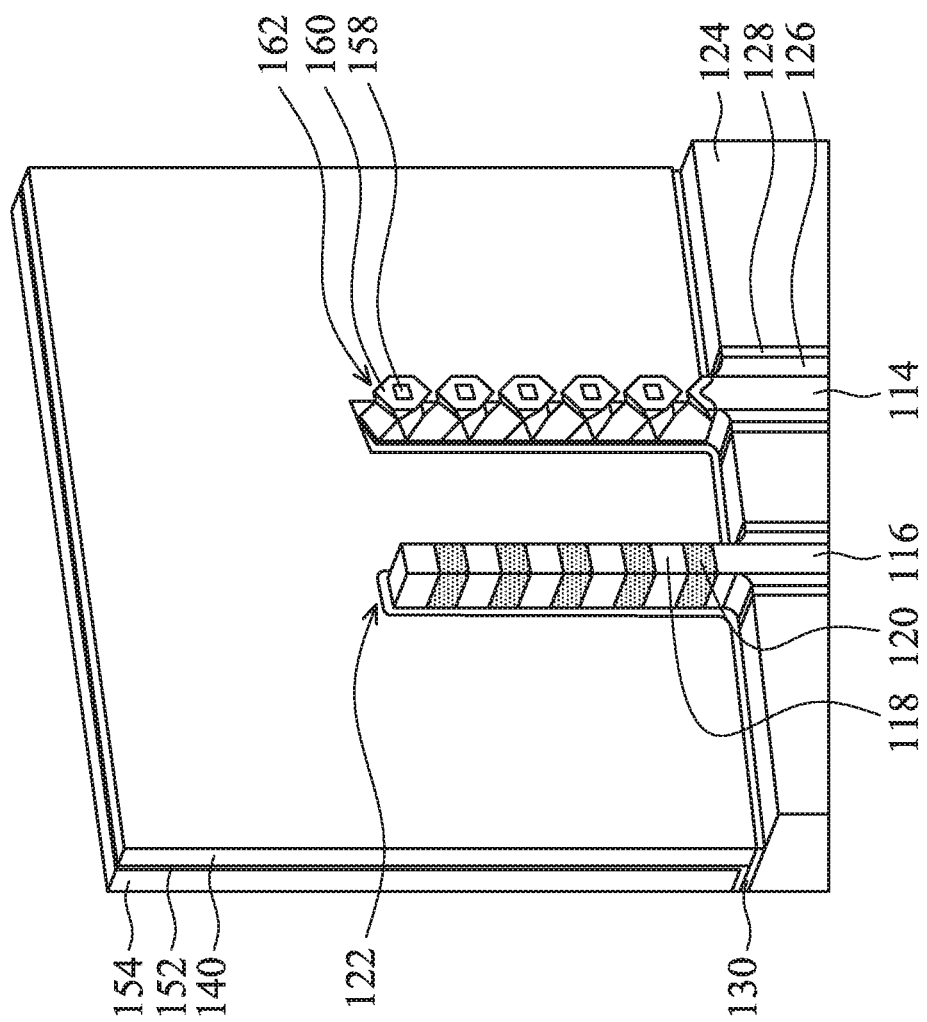

Afterwards, as shown in FIGS. 2C and 4C, a cladding layer 160 is formed to surround the semiconductor material wire 158 to form a first nanowire 162, in accordance with some embodiments. In some embodiments of the present disclosure, the cladding layer 160 is made of silicon, silicon germanium, germanium tin, silicon germanium tin, gallium arsenide, indium gallium arsenide, indium arsenide, another suitable material, or a combination thereof. In some embodiments of the present disclosure, the material of the cladding layer 160 is the same as the material of the semiconductor material wire 158. In some embodiments of the present disclosure, In some embodiments, the cladding layer 160 is formed using an epitaxial growth process. The cladding layer 160 may be formed using a selective epitaxial growth (SEG) process, a chemical vapor deposition (CVD) process (e.g., a vapor-phase epitaxy (VPE) process, a low-pressure CVD (LPCVD) process, and/or an ultra-high vacuum CVD (UHV-CVD) process), a molecular beam epitaxy process, another applicable process, or a combination thereof.

As shown in FIG. 4C, the first nanowire 162 includes two first edge portions 164 adjacent to the two source/drain portions 150 respectively, in accordance with some embodiments. As shown in FIG. 4C, the first nanowire 162 includes one first central portion 166 between the two first edge portions 164, in accordance with some embodiments. As shown in FIG. 4C, the first nanowire 162 is adjacent to the source/drain portions 150, in accordance with some embodiments.

Figure 2F:
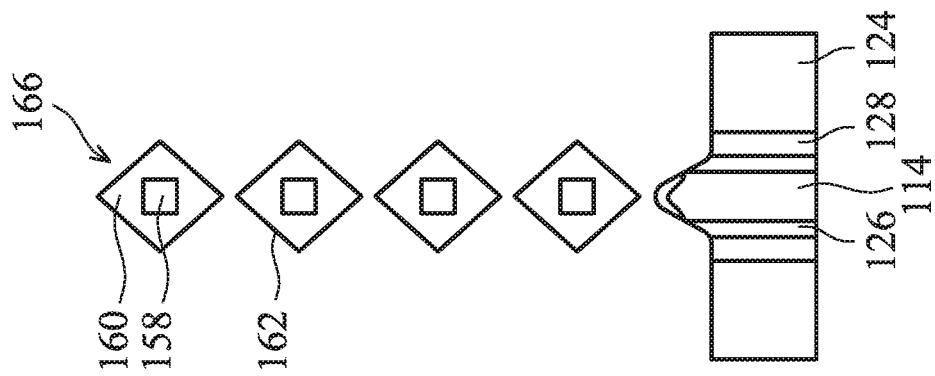
FIG. 2F is a cross-sectional view of a nanowire in accordance with some embodiments of the present disclosure.
Figure 2E:
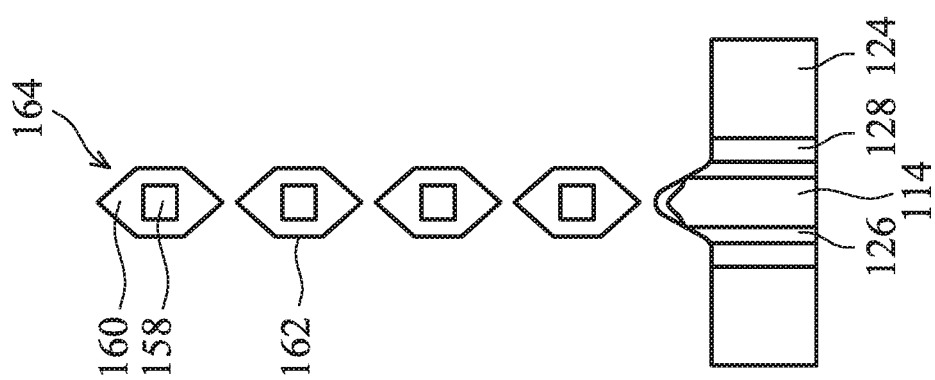
FIG. 2E is a cross-sectional view of a nanowire in accordance with some embodiments of the present disclosure.
Figure 2D:
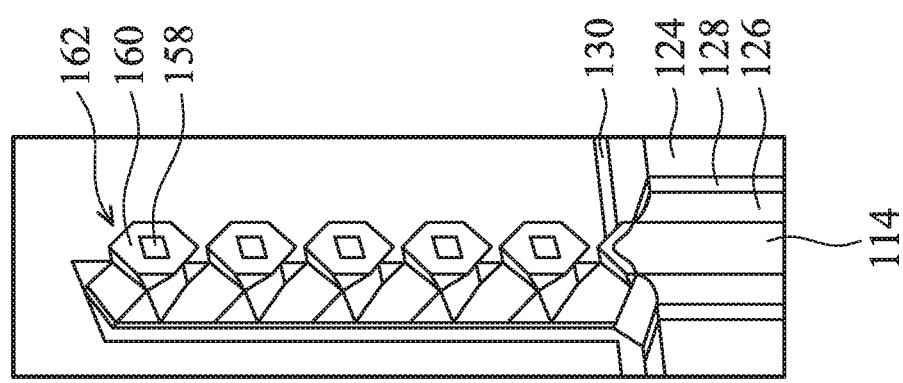
FIG. 2D is a schematic view of a nanowire in accordance with some embodiments of the present disclosure.

FIG. 2D is an enlarged view of the first nanowire 162 in accordance with some embodiments of the present disclosure, FIG. 2E is a cross-sectional view of the first edge portions 164 of the first nanowire 162 in accordance with some embodiments of the present disclosure, and FIG. 2F is a cross-sectional view of the first central portion 166 of the first nanowire 162 in accordance with some embodiments of the present disclosure.

As shown in FIGS. 2E and 2F, the first nanowire 162 has a polygonal cross-section, in accordance with some embodiments. Specifically, as shown in FIG. 2E, the two first edge portions 164 have a hexagonal cross-section, in accordance with some embodiments. As shown in FIG. 2F, the first central portion 166 has a quadrilateral cross-section, in accordance with some embodiments.

In some embodiments of the present disclosure, since the first nanowire 162 includes the semiconductor material wire 158 and the cladding layer 160, rather than only including the semiconductor material wire 158, the cross-sectional area of the first nanowire 162 is increased. Therefore, in some embodiments of the present disclosure, the current flowing through the first nanowire 162 under a given voltage is increased, and the drain-induced barrier lowering issue is reduced, compared to the nanowire with a circular cross-section or the FinFET transistor.

As shown in FIGS. 2E and 2F, the first nanowires 162 vertically arranged over the first fin portion 114, and two adjacent first nanowires 162 are spaced apart from each other. However, the embodiments of the present disclosure are not limited thereto. In some other embodiments, two adjacent first nanowires 162 contact each other.

Still referring to FIGS. 2C to 2F, the cross-sectional area of the first nanowire 162 vary from the edge portion 164 to the central portion 166, in accordance with some embodiments. As shown in FIGS. 2C to 2F, the edge portion 164 of the first nanowire 162 has a first cross-sectional area, and the central portion 166 of the first nanowire 162 has a second cross-sectional area, in accordance with some embodiments. In some embodiments of the present disclosure, the first cross-sectional area is greater than the second cross-sectional area.

Afterwards, the mask element 156 is removed, in accordance with some embodiments. Afterwards, as shown in FIG. 1I, similar processes are performed to form second nanowires 168 over the second fin portion 116, in accordance with some embodiments. In some embodiments, the material of second nanowires 168 is different than the material of first nanowire 162. In some embodiments of the present disclosure, the second nanowires 168 are made of silicon, silicon germanium, germanium tin, silicon germanium tin, gallium arsenide, indium gallium arsenide, indium arsenide, another suitable material, or a combination thereof. In some embodiments of the present disclosure, the second nanowires 168 are made of silicon germanium, and the first nanowires 162 are made of silicon. In some embodiments of the present disclosure, two second source/drain portions 148 are adjacent to the second nanowire 168.

Figure 3B:
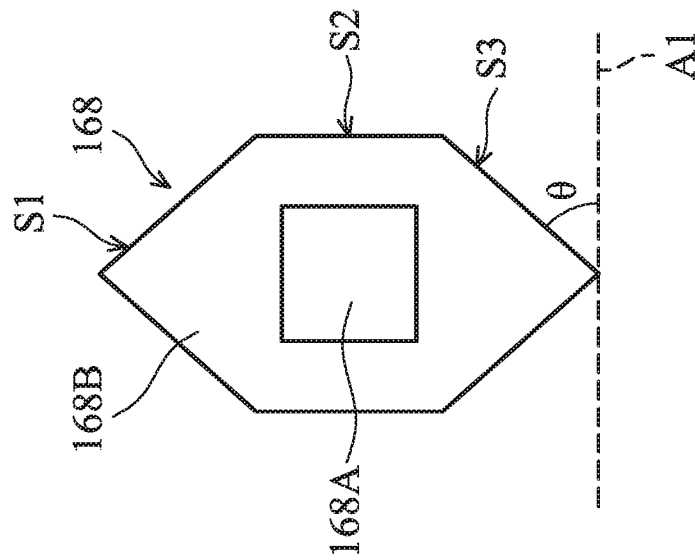
FIG. 3B is a cross-sectional view of a nanowire in accordance with some embodiments of the present disclosure.
Figure 3A:
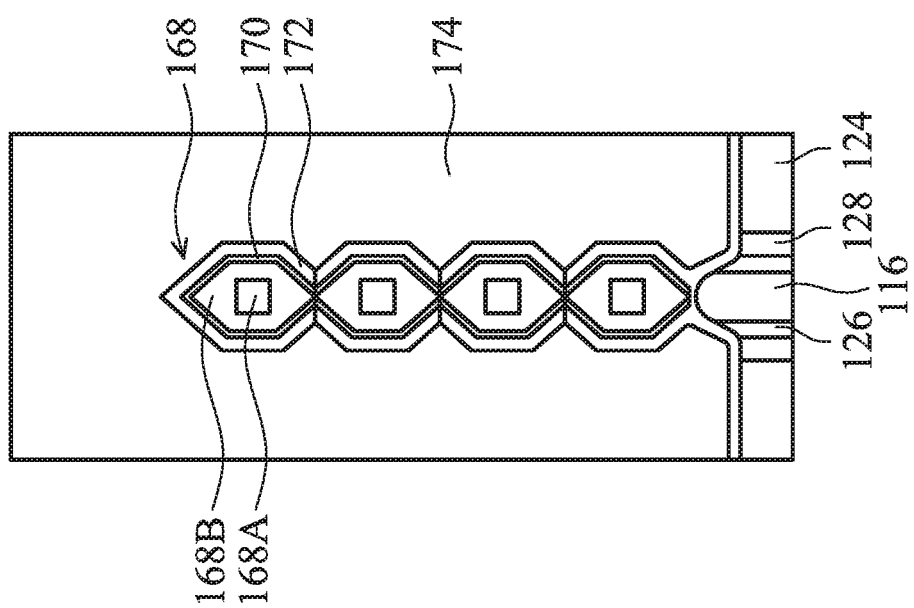
FIG. 3A is a cross-sectional view of a nanowire in accordance with some embodiments of the present disclosure.

In some embodiments of the present disclosure, the second nanowires 168 have the same or similar cross-section or shape as that of the first nanowire 162. FIGS. 3A and 3B are cross-sectional views of the edge portion of the second nanowires 168 in accordance with some embodiments of the present disclosure. FIG. 3A also shows the subsequently formed gate dielectric layer and the gate electrode surrounding the second nanowires 168 in accordance with some embodiments of the present disclosure. As shown in FIG. 3A, the second nanowires 168 also includes a semiconductor material wire 168A and a cladding layer 168B surrounding the semiconductor material wire 168A. As shown in FIG. 3A, two adjacent second nanowires 168 contact each other. However, the embodiments of the present disclosure are not limited thereto. In some other embodiments, two adjacent second nanowires 168 are spaced apart from each other.

As shown in FIG. 3B, the direction A1 is the direction parallel to the top surface of the first fin portion 114, the second fin portion 116 or the base portion 112, in accordance with some embodiments. As shown in FIG. 3B, the sides S1 and S3 are the slanted sides of the second nanowires 168, and the side S2 is the vertical side of the second nanowires 168, in accordance with some embodiments.

In some embodiments of the present disclosure, the side S1 has <111> crystal plane. In some embodiments of the present disclosure, the side S2 has <110> crystal plane. In some embodiments of the present disclosure, the first nanowires 162 have the same or similar crystal plane as that of the second nanowires 168.

As shown in FIG. 3B, the side S3 and the direction A1 intersect at an acute angle θ. In some embodiments of the present disclosure, the acute angle θ is in a range from about 40 degrees to about 70 degrees, for example from about 50 degrees to about 60 degrees, or about 54.74 degrees.

The term "about" typically means +/−20% of the stated value, more typically +/−10% of the stated value, more typically +/−5% of the stated value, more typically +/−3% of the stated value, more typically +/−2% of the stated value, more typically +/−1% of the stated value and even more typically +/−0.5% of the stated value. The stated value of the present disclosure is an approximate value. When there is no specific description, the stated value includes the meaning of "about".

Afterwards, as shown in FIG. 1I, a gate dielectric layer 170, a work function layer 172 and a gate electrode layer 174 are sequentially formed to surround the first nanowire 162 and the second nanowires 168, in accordance with some embodiments. In some embodiments of the present disclosure, the gate dielectric layer 170, the work function layer 172 and the gate electrode layer 174 form the gate structure 176 surrounding the first nanowire 162 and the second nanowires 168. As shown in FIG. 1I, the work function layer 172 surrounds the gate dielectric layer 170, and the gate electrode layer 174 surrounds the work function layer 172, in accordance with some embodiments.

As shown in FIG. 1I, a gate dielectric layer 170 surrounds the first nanowire 162 and the second nanowires 168, in accordance with some embodiments. In some embodiments, the gate dielectric layer 170 is made of metal oxide, metal nitride, metal silicide, transition metal oxide, transition metal nitride, transition metal silicide, transition metal oxynitride, metal aluminate, zirconium silicate, zirconium aluminate. For example, the material of the gate dielectric layer 170 may include, but is not limited to, LaO, AlO, ZrO, TiO, $Ta_2O_5$, $Y_2O_3$, $SrTiO_3$(STO), $BaTiO_3$(BTO), BaZrO, $HfO_2$, $HfO_3$, HfZrO, HfLaO, HfSiO, HfSiON, LaSiO, AlSiO, HfTaO, HfTiO, HfTaTiO, HfAlON, $(Ba,Sr)TiO_3$ (BST), $Al_2O_3$, any other suitable high-k dielectric material, or a combination thereof.

In some embodiments, applicable deposition methods for depositing the gate dielectric layer 170 include a chemical vapor deposition (CVD) process, an atomic layer deposition (ALD) process, a thermal oxidation process, a spin-on coating process, other applicable processes, and combinations thereof.

In some embodiments of the present disclosure, the work function layer 172 provides the desired work function for transistors to enhance device performance, including improved threshold voltage. In the embodiments of forming an NMOS transistor, the work function layer 172 can be an N-type metal capable of providing a work function value suitable for the device. The work function value is, for example, equal to or less than about 4.5 eV. The n-type metal may include metal, metal carbide, metal nitride, or a combination thereof. For example, the N-type metal includes tantalum, tantalum nitride, or a combination thereof. In some embodiments, the gate electrode 174 includes the N-type metal.

On the other hand, in the embodiments of forming a PMOS transistor, the work function layer 172 can be a P-type metal capable of providing a work function value suitable for the device. The work function value is, for example, equal to or greater than about 4.8 eV. The P-type metal may include metal, metal carbide, metal nitride, other suitable materials, or a combination thereof. For example, the P-type metal includes titanium, titanium nitride, other suitable materials, or a combination thereof. In some embodiments, the gate electrode 174 includes the P-type metal.

The work function layer 172 may also be made of hafnium, zirconium, titanium, tantalum, aluminum, metal carbides (e.g., hafnium carbide, zirconium carbide, titanium carbide, aluminum carbide), aluminides, ruthenium, palladium, platinum, cobalt, nickel, conductive metal oxides, or a combination thereof.

In some embodiments, the work function layer 172 (such as an N-type metal) are deposited using an applicable deposition process. Examples of an applicable deposition process include a PVD process, a plating process, a CVD process, other applicable processes, and combinations thereof.

In some embodiments, the gate electrode layer 174 is made of a suitable metal material. The suitable metal material may include aluminum, tungsten, gold, platinum, cobalt, other suitable metal materials, an alloy thereof, or a combination thereof. In some embodiments of the present disclosure, the gate electrode layer 174 is deposited over the work function layer 172 by using, for example, a PVD process, a plating process, a CVD process, or the like.

Afterwards, as shown in FIG. 1J, top portions of the work function layer 172 and the gate electrode layer 174 are removed, in accordance with some embodiments. Afterwards, as shown in FIG. 1J, a sacrificial layer 178 is formed over the work function layer 172 and the gate electrode layer 174. In some embodiments of the present disclosure, the sacrificial layer 178 is made of silicon nitride, silicon oxide, silicon oxynitride, another suitable dielectric material, or a combination thereof.

Afterwards, as shown in FIG. 1K, the interlayer dielectric layer 154 is removed, in accordance with some embodiments. Afterwards, as shown in FIG. 1L, a patterned dummy material layer 180 is formed to cover a portion of the etch stop layer 152, the spacer elements 140 and the sacrificial layer 178, in accordance with some embodiments. As shown in FIG. 1L, the patterned dummy material layer 180 has an opening 182 exposing another portion of the etch stop layer 152, the spacer elements 140 and the sacrificial layer 178, in accordance with some embodiments.

Afterwards, as shown in FIG. 1M, an interlayer dielectric layer 184 is formed in the opening 182, in accordance with some embodiments. In some embodiments, the interlayer dielectric layer 184 is made of silicon oxide, silicon oxynitride, borosilicate glass (BSG), phosphoric silicate glass (PSG), borophosphosilicate glass (BPSG), fluorinated silicate glass (FSG), low-k material, porous dielectric material, another suitable material, or a combination thereof. In some embodiments, the interlayer dielectric layer 184 is deposited using a CVD process, an ALD process, a spin-on process, a spray coating process, another applicable process, or a combination thereof.

In some embodiments, a dielectric layer is deposited over the patterned dummy material layer 180 and filled into the opening 182 using a chemical vapor deposition (CVD) process, a spin-on process, another applicable process, or a combination thereof. In some embodiments, a planarization process is performed to thin down the dielectric layer. For example, the dielectric layer is thinned until the patterned dummy material layer 180 is exposed. The planarization process may include a chemical mechanical polishing (CMP) process, a grinding process, a dry polishing process, an etching process, another applicable process, or a combination thereof. As a result, the interlayer dielectric layer 184 and the structure shown in FIG. 1M are formed.

Afterwards, as shown in FIG. 1N, the patterned dummy material layer 180 and the portion of the etch stop layer 152 not covered by the interlayer dielectric layer 184 are removed, in accordance with some embodiments.

Afterwards, as shown in FIG. 1O, a barrier layer 186 is conformally deposited over the interlayer dielectric layer 184, the spacer elements 140, the source/drain portions 148 and 150, and the sacrificial layer 178, in accordance with some embodiments. In some embodiments of the present disclosure, the barrier layer 186 is made of titanium nitride, titanium, another suitable material, or a combination thereof. As shown in FIG. 1O, recesses 188 are formed over the source/drain portions 148 and 150, in accordance with some embodiments.

Afterwards, as shown in FIG. 1P, a contact plug 190 is formed in the recesses 188, in accordance with some embodiments. In some embodiments of the present disclosure, the contact plug 190 is made of a single layer or multiple layers of cobalt, copper, aluminum, tungsten, gold, chromium, nickel, platinum, titanium, iridium, rhodium, an alloy thereof, a combination thereof, or another conductive material.

In some embodiments of the present disclosure, a contact material layer (not shown in this figure) is deposited over the barrier layer 186 and filled into the recesses 188. In some embodiments, the applicable deposition methods for depositing the contact material layer include a chemical vapor deposition (CVD) process, a physical vapor deposition (PVD) process, and other applicable methods.

Afterwards, in some embodiments, a planarization process is performed to thin down the contact material layer and the barrier layer 186. For example, the contact material layer and the barrier layer 186 are thinned until the sacrificial layer 178 is exposed. The planarization process may include a chemical mechanical polishing (CMP) process, a grinding process, a dry polishing process, an etching process, another applicable process, or a combination thereof. As a result, the contact plug 190 and the semiconductor device structure 100 shown in FIG. 1P are formed. In some embodiments of the present disclosure, the contact plugs 190 are electrically connected to the source/drain portion 148 and/or the source/drain portion 150.

Figure 5B:
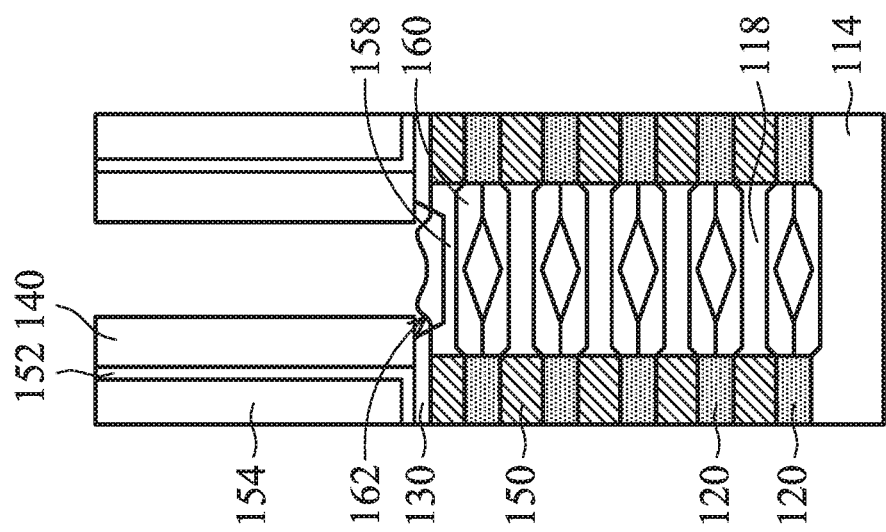
FIGS. 5A-5B are schematic views of various stages of a process for forming a semiconductor device structure, in accordance with some embodiments.
Figure 5A:
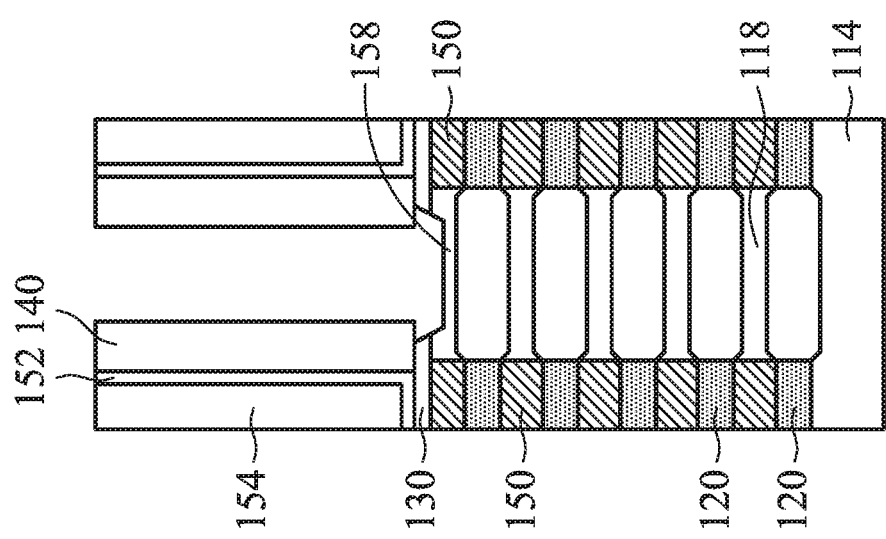

It should be noted that the exemplary embodiment set forth in FIGS. 1A-1P is merely for the purpose of illustration. In addition to the embodiment set forth in FIGS. 1A-1P, the nanowire may be formed by another method as shown in FIGS. 5A-5B. This will be described in more detail in the following description. Therefore, the present disclosure is not limited to the exemplary embodiment shown in FIGS. 1A-1P.

Note that the same or similar elements or layers corresponding to those of the semiconductor device are denoted by like reference numerals. In some embodiments, the same or similar elements or layers denoted by like reference numerals have the same meaning and will not be repeated for the sake of brevity.

As shown in FIG. 5A, after the semiconductor material wires, such as the semiconductor material wires 158, are formed, and before forming the cladding layer 160, an outer portion of the semiconductor material wire 158 is removed by an etching process, such as an anisotropic etching process, in accordance with some embodiments. As shown in FIG. 5A, a portion of the semiconductor material wire 158 remains, in accordance with some embodiments.

As shown in FIG. 5B, after the semiconductor material wire 158 is partially etched and partially removed, the cladding layer 160 is formed to surround the remaining portion of the semiconductor material wire 158 to form the first nanowire 162, in accordance with some embodiments. As shown in FIG. 5B, a portion of the semiconductor material wire 158 has a thickness that is less than that of the first source/drain portion 150.

Figure 6C:
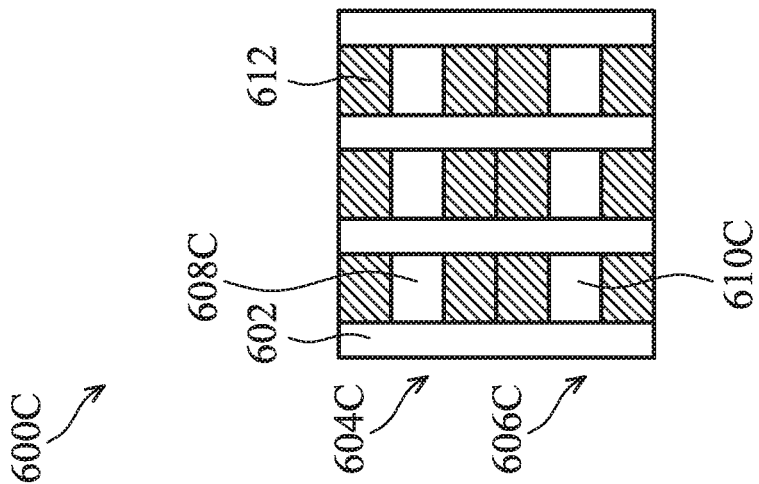
FIG. 6C is a top view of a semiconductor device structure in accordance with some embodiments of the present disclosure.
Figure 6B:
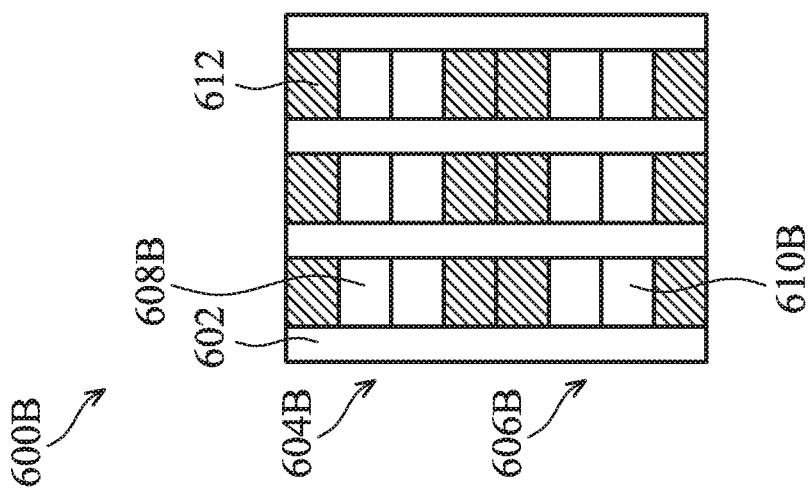
FIG. 6B is a top view of a semiconductor device structure in accordance with some embodiments of the present disclosure.
Figure 6A:
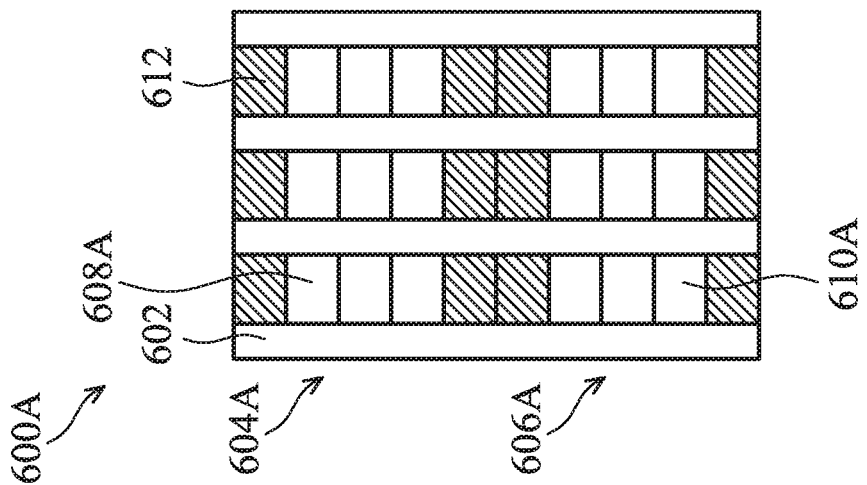
FIG. 6A is a top view of a semiconductor device structure in accordance with some cases.

FIG. 6A is a top view of a semiconductor device structure 600A in accordance with some cases. In some cases, the semiconductor device structure 600A includes a P-type FET 604A and an N-type FET 606A. In some cases, the P-type FET 604A includes three or more fin structures 608A which use a portion of the fin structures 608A or a nanowire with a circular cross-section as a channel. In some cases, the N-type FET 606A includes three or more fin structures 610A which use a portion of the fin structures 610A or a nanowire with a circular cross-section as a channel. In addition, a dielectric layer 612 is positioned between the P-type FET 604A and the N-type FET 606A. In addition, one or more gate structures 602 traverse through the fin structures 608A and 610A.

FIG. 6B is a top view of a semiconductor device structure 600B in accordance with some embodiments. In some embodiments, the semiconductor device structure 600B includes a P-type FET 604B and an N-type FET 606B. In some embodiments, the P-type FET 604B includes two fin structures 608B which use a nanowire with a polygonal cross-section as a channel. In some embodiments, the N-type FET 606B includes two fin structures 610B which use a nanowire with a polygonal cross-section as a channel.

Since the nanowire in the embodiments of the present disclosure has a polygonal cross-section, the current flowing through the nanowire in the embodiments of the present disclosure under a given voltage is increased, and the drain-induced barrier lowering issue is reduced, compared to the device using nanowire with a circular cross-section or the FinFET transistor. Therefore, the P-type FET 604B and the N-type FET 606B may use fewer fin structures 606B and 608B and fewer tracks compared to the device using nanowire with a circular cross-section or the FinFET transistor.

FIG. 6C is a top view of a semiconductor device structure 600C in accordance with some embodiments. In some embodiments, the semiconductor device structure 600C includes a P-type FET 604C and an N-type FET 606C. In some embodiments, the P-type FET 604C includes one fin structure 608C which uses a nanowire with a polygonal cross-section as a channel. In some embodiments, the N-type FET 606C includes one fin structure 610C which uses a nanowire with a polygonal cross-section as a channel.

Since the nanowire in the embodiments of the present disclosure has a polygonal cross-section, the current flowing through the nanowire in the embodiments of the present disclosure under a given voltage is increased, and the drain-induced barrier lowering issue is reduced, compared to the device using nanowire with a circular cross-section or the FinFET transistor. Therefore, the P-type FET 604C and the N-type FET 606C may use fewer fin structures 606C and 608C and fewer tracks compared to the device using nanowire with a circular cross-section or the FinFET transistor.

Embodiments of the disclosure use nanowire with a polygonal cross-section. Therefore, the current flowing through the nanowire in the embodiments of the present disclosure under a given voltage is increased, and the drain-induced barrier lowering issue is reduced, compared to the device using nanowire with a circular cross-section or the FinFET transistor.

Embodiments of the disclosure are not limited and may be applied to fabrication processes for any suitable technology generation. Various technology generations include a 20 nm node, a 16 nm node, a 10 nm node, or another suitable node.

In accordance with some embodiments, a semiconductor device structure is provided. The semiconductor device structure includes a substrate including a first fin portion, a first nanostructure over the first fin portion. The first nanostructure has a dumbbell shape. The first nanostructure includes a semiconductor material layer over the first fin portion, and a cladding layer surrounding the semiconductor material layer. The semiconductor material layer has a rectangular shape, and the cladding layer has a hexagonal or quadrilateral shape. The semiconductor device structure includes a first gate structure surrounding the first nanostructure.

In accordance with some embodiments, a semiconductor device structure is provided. The semiconductor device structure includes a first nanostructure formed over a substrate, and the first nanostructure comprises a first edge portion and a central portion. The first edge portion has a first height along a first direction, and the first direction is vertical to a top surface of the substrate, the central portion has a second height along the first direction, and the first height is greater than the second height. The semiconductor device structure includes a first gate structure surrounding the first nanostructure.

In accordance with some embodiments, a method for forming a semiconductor device structure is provided. The method includes providing a substrate having a fin, and the fin portion has a channel region and a source/drain region. The method includes forming a stack structure over a fin, and the stack structure comprises a first semiconductor layer and a second semiconductor layer vertically stacked over the fin. The method also includes removing a portion of the second semiconductor layer in the channel region, and a portion of the first semiconductor layer is remaining in the channel region. The method further includes forming a cladding layer over the remaining first semiconductor material layer in the channel region to form a nanostructure, wherein the nanostructure has a dumbbell shape. The method includes forming a gate structure surrounding the nanostructure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
 a substrate comprising a first fin portion;
 a first nanostructure over the first fin portion, wherein the first nanostructure has a dumbbell shape, wherein the first nanostructure comprises:
  a semiconductor material layer over the first fin portion, wherein the semiconductor material layer has a rectangular shape; and
  a cladding layer surrounding the semiconductor material layer, wherein the cladding layer has a hexagonal or quadrilateral shape; and
 a first gate structure surrounding the first nanostructure;
 wherein the substrate further comprises a second fin portion adjacent to the first fin portion, wherein the semiconductor device structure further comprises:
  a second nanostructure over the second fin portion, wherein the second nanostructure is made of a different material than that of the first nanostructure, and the second nanostructure has a dumbbell shape.

2. The semiconductor device structure as claimed in claim 1, wherein the first gate structure comprises a first gate dielectric layer, and the first gate dielectric layer surrounds the cladding layer, and the first gate dielectric layer has a hexagonal shape.

3. The semiconductor device structure as claimed in claim 1, further comprising:
 two first source/drain portions adjacent to the first nanostructure,
 wherein the first nanostructure comprises two first edge portions and one central portion, the two first edge portions are adjacent to the two first source/drain portions respectively and have a hexagonal shape.

4. The semiconductor device structure as claimed in claim 3, wherein a dimension of the first nanostructure is tapered from the first edge portion to the central portion.

5. The semiconductor device structure as claimed in claim 3, wherein one of the edge portions has a first cross-sectional area, and the central portion has a second cross-sectional area greater than the first cross-sectional area.

6. The semiconductor device structure as claimed in claim 3, wherein the semiconductor material layer has a thickness that is less than the thickness of one of first source/drain portions.

7. The semiconductor device structure as claimed in claim 1, further comprising:
   a plurality of first nanostructure stacked over the first fin portion, wherein two adjacent first nanostructures are spaced apart from each other.

8. The semiconductor device structure as claimed in claim 1, wherein the cladding layer is separated from the first fin portion.

9. A semiconductor device structure, comprising:
   a first nanostructure formed over a substrate, wherein the first nanostructure comprises a first edge portion and a central portion;
   wherein the first edge portion has a first height along a first direction, and the first direction is vertical to a top surface of the substrate;
   the central portion has a second height along the first direction, and the first height is greater than the second height; and
   a first gate structure surrounding the first nanostructure.

10. The semiconductor device structure as claimed in claim 8, wherein the first edge portion has a first width along a second direction, the second direction is parallel to the top surface of the substrate, and the first height is greater than the first width.

11. The semiconductor device structure as claimed in claim 8, wherein a dimension of the first nanostructure is tapered from the first edge portion to the central portion.

12. The semiconductor device structure as claimed in claim 8, wherein the first nanostructure comprises a first semiconductor layer and a first cladding layer surrounding the first semiconductor layer, the first cladding layer has a hexagonal shape.

13. The semiconductor device structure as claimed in claim 12, wherein the first cladding layer has a first sidewall and a second sidewall connecting to the first sidewall, and the first sidewall has <111> crystal plane, and the second sidewall has <110> crystal plane.

14. The semiconductor device structure as claimed in claim 8, wherein the first nanostructure has a dumbbell shape.

15. The semiconductor device structure as claimed in claim 8, further comprising:
    a second nanostructure formed over the substrate, wherein the second nanostructure comprises a second cladding layer surrounding a second semiconductor layer, wherein the second cladding layer has a hexagonal shape.

16. A semiconductor device structure, comprising:
    a substrate comprising a first fin portion and a second fin portion;
    a plurality of first nanostructures over the first fin portion, wherein two of the plurality of first nanostructures are spaced apart from each other, wherein one of the first nanostructures comprises:
        a first semiconductor material layer over the first fin portion, wherein the first semiconductor material layer has a rectangular shape; and
        a first cladding layer surrounding the semiconductor material layer, wherein the first cladding layer has a hexagonal or quadrilateral shape; and
    a plurality of second nanostructures over the second fin portion, wherein two of the plurality of second nanostructures contact each other.

17. The semiconductor device structure as claimed in claim 16, wherein one of the second nanostructures comprises:
    a second semiconductor material layer over the second fin portion; and
    a second cladding layer over the second semiconductor material layer, wherein the second cladding layer has two vertical sides which are vertical to a top surface of the second fin portion.

18. The semiconductor device structure as claimed in claim 17, wherein the second cladding layer of the second nanostructures has a sloped side, and the sloped side and the top surface of the second fin portion intersect at an acute.

19. The semiconductor device structure as claimed in claim 16, wherein one of the first nanostructures has a dumbbell shape.

20. The semiconductor device structure as claimed in claim 16, wherein the first nanostructure comprises an edge portions and a central portion, and a dimension of the first nanostructure is tapered from the edge portion to the central portion.

* * * * *